United States Patent

Sasaki et al.

(10) Patent No.: US 9,748,104 B2
(45) Date of Patent: Aug. 29, 2017

(54) METHOD OF DEPOSITING FILM

(71) Applicant: Tokyo Electron Limited, Tokyo (JP)

(72) Inventors: Hiroko Sasaki, Iwate (JP); Yu Wamura, Iwate (JP); Masato Koakutsu, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 141 days.

(21) Appl. No.: 14/337,331

(22) Filed: Jul. 22, 2014

(65) Prior Publication Data

US 2015/0031204 A1   Jan. 29, 2015

(30) Foreign Application Priority Data

Jul. 24, 2013   (JP) ................... 2013-153338

(51) Int. Cl.
 *C23C 16/34*   (2006.01)
 *C23C 16/40*   (2006.01)
 (Continued)

(52) U.S. Cl.
 CPC ...... *H01L 21/28556* (2013.01); *C23C 16/308* (2013.01); *C23C 16/34* (2013.01);
 (Continued)

(58) Field of Classification Search
 CPC .............. C23C 16/34; C23C 16/45525; C23C 16/45551; H01L 21/76838; H01L 21/76856
 See application file for complete search history.

(56) References Cited

U.S. PATENT DOCUMENTS 5,378,501 A * 1/1995 Foster ..................... C23C 16/34
 427/248.1
5,567,243 A * 10/1996 Foster ..................... C23C 16/04
 118/723 E (Continued)

FOREIGN PATENT DOCUMENTS

JP   11-140652   *   5/1999
JP   2005-079543       3/2005

(Continued)

OTHER PUBLICATIONS

Tiznado, Hugo, et al., "Surface Chemistry in the Atomic Layer Deposition of TiN Films from TiCl4 and Ammonia". J. Phys. Chem. B 2006, 110, 13491-13498.*

(Continued)

*Primary Examiner* — Bret Chen
(74) *Attorney, Agent, or Firm* — IPUSA, PLLC

(57) ABSTRACT

A method of depositing a film is provided. In the method, one operation of a unit of film deposition process is performed by carrying a substrate into a processing chamber, by depositing a nitride film on the substrate, and by carrying the substrate out of the processing chamber after finishing depositing the nitride film on the substrate. The one operation is repeated a predetermined plurality of number of times continuously to deposit the nitride film on a plurality of substrates continuously. After that, an inside of the processing chamber is oxidized by supplying an oxidation gas into the processing chamber.

16 Claims, 13 Drawing Sheets

(51) Int. Cl.
*H01L 21/285* (2006.01)
*C23C 16/30* (2006.01)
*C23C 16/455* (2006.01)
*H01L 21/768* (2006.01)

(52) U.S. Cl.
CPC ...... *C23C 16/405* (2013.01); *C23C 16/45529* (2013.01); *C23C 16/45531* (2013.01); *C23C 16/45551* (2013.01); *H01L 21/76841* (2013.01); *H01L 21/76856* (2013.01)

(56) References Cited

U.S. PATENT DOCUMENTS

| | | | | |
|---|---|---|---|---|
| 6,527,968 | B1* | 3/2003 | Wang | H01J 37/321 134/1.1 |
| 6,635,569 | B1* | 10/2003 | Ameen | C23C 16/4404 134/1.1 |
| 7,172,657 | B2* | 2/2007 | Kojima | C23C 16/4405 134/102.1 |
| 7,473,637 | B2* | 1/2009 | Kraus | C23C 16/34 257/915 |
| 2004/0013803 | A1* | 1/2004 | Chung | C23C 16/45525 427/255.391 |
| 2005/0214454 | A1* | 9/2005 | Yang | B08B 7/0035 427/248.1 |
| 2005/0214455 | A1* | 9/2005 | Li | C23C 16/4405 427/248.1 |
| 2006/0110534 | A1* | 5/2006 | Hwang | C23C 16/34 427/248.1 |
| 2006/0216417 | A1* | 9/2006 | Todd | C23C 16/45523 427/248.1 |
| 2008/0096369 | A1* | 4/2008 | Strzyzewski | C23C 16/45551 438/478 |
| 2008/0169449 | A1* | 7/2008 | Mundschau | B01D 69/141 252/373 |
| 2008/0260946 | A1* | 10/2008 | Tan | C23C 16/4405 427/248.1 |
| 2009/0124083 | A1* | 5/2009 | Nodera | C23C 16/0218 438/694 |
| 2009/0208668 | A1* | 8/2009 | Choi | C23C 16/4405 427/569 |
| 2009/0246367 | A1* | 10/2009 | Huotari | B82Y 30/00 427/215 |
| 2011/0086517 | A1* | 4/2011 | Honda | H01L 21/0217 438/792 |
| 2013/0284204 | A1* | 10/2013 | Xie | B08B 7/0021 134/1.1 |

FOREIGN PATENT DOCUMENTS

| | | |
|---|---|---|
| JP | 2008-140864 | 6/2008 |
| JP | 2010-219308 | 9/2010 |
| JP | 2011-068984 | 4/2011 |
| JP | 2012-184499 | 9/2012 |

OTHER PUBLICATIONS

Faltermeier, Cheryl, et al., "Barrier Properties of Titanium Nitride Films Grown by Low Temperature Chemical Vapor Deposition from Titanium Tetraiodide". J. Electrochemic. Soc., vol. 144, No. 3, Mar. 1997, pp. 1002-1008.*

Ioannides, Theophilos, et al., "Development of a novel heat-integrated wall reactor for the partial oxidation of methane to synthesis gas". Catalysis Today, 46, (1998) 71-81.*

Kastenmeier, B.E.E., et al., "Remote plasma etching of silicon nitride and silicon dioxide using NF3/O2 gas mixtures". J. Vac. Sci. Technol. A 16(4), Jul./Aug. 1998, pp. 2047-2056.*

* cited by examiner

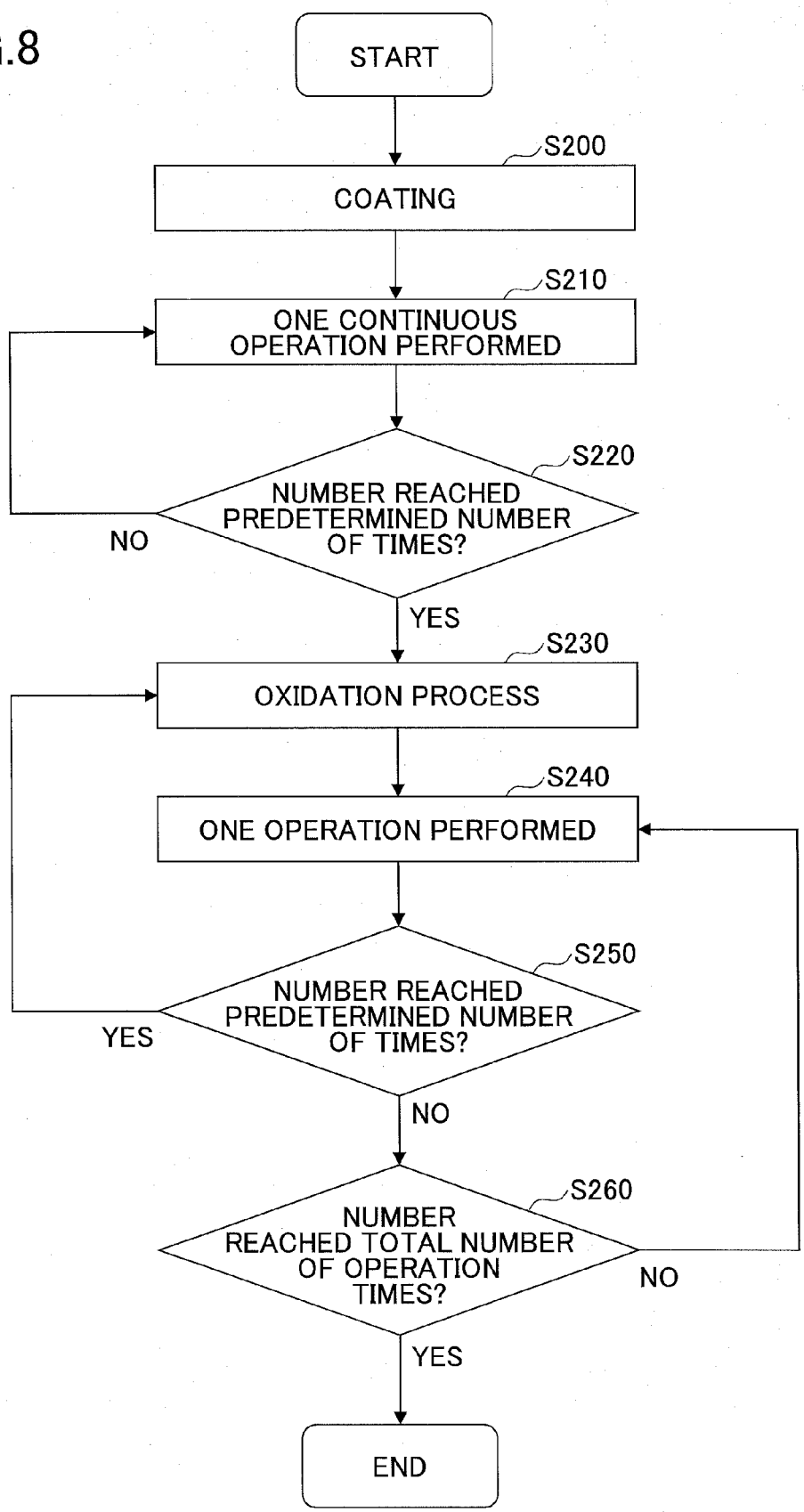

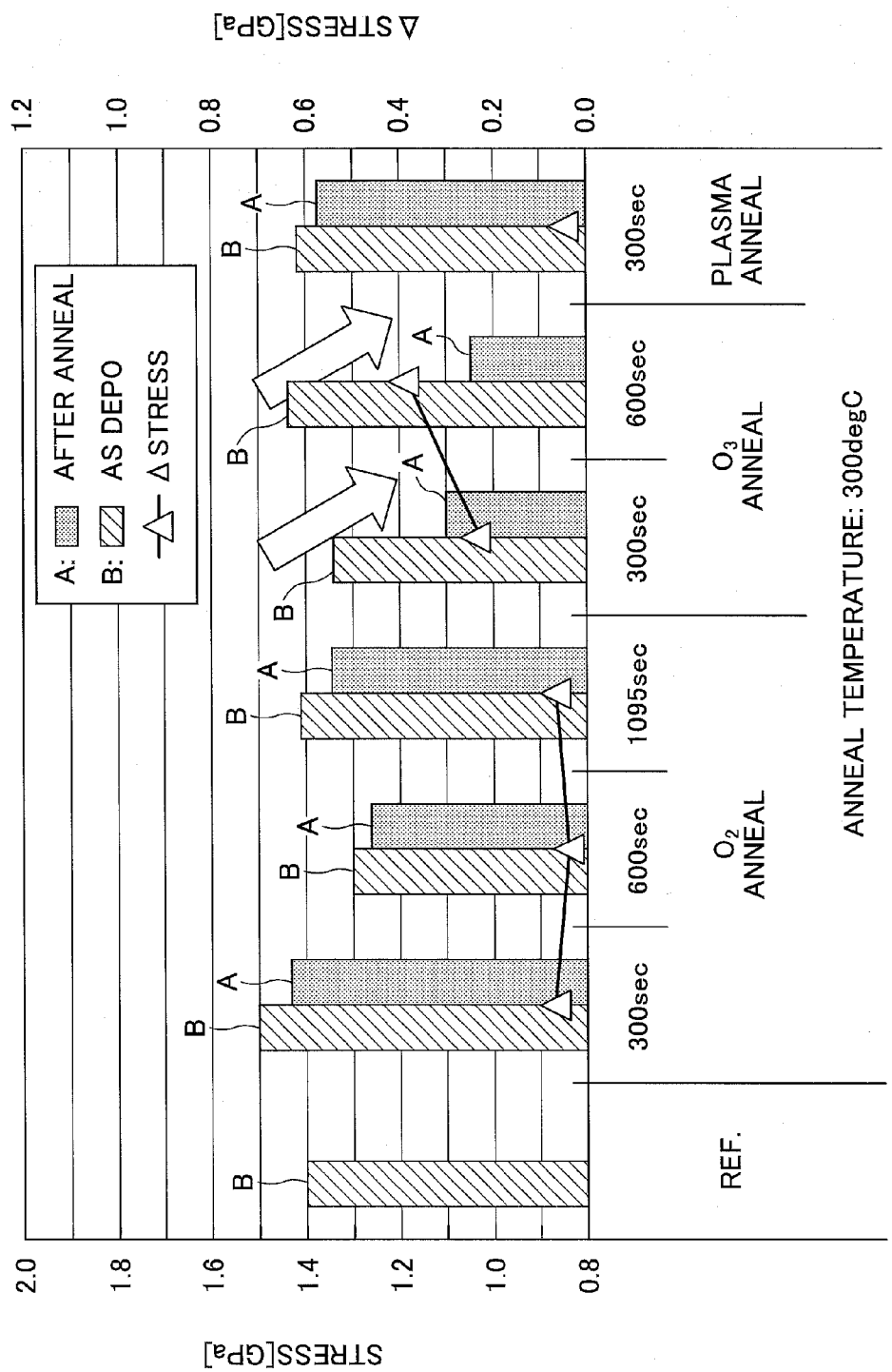

METHOD OF DEPOSITING FILM

CROSS-REFERENCE TO RELATED APPLICATIONS

This patent application is based upon and claims the benefit of priority of Japanese Patent Application No. 2013-153338 filed on Jul. 24, 2013, the entire contents of which are incorporated herein by reference.

BACKGROUND OF THE INVENTION

1. Field of the Invention

The present invention relates to a method of depositing a film.

2. Description of the Related Art

Conventionally, as disclosed in Japanese Laid-Open Patent Application Publication No. 2005-79543, a method is known of depositing a Ti film by depositing a Ti film on a substrate to be processed by CVD at first, next by oxidizing a surface of the Ti film, and finally by processing the surface of the Ti film by nitriding. In the method of depositing the TiN film disclosed in Japanese Laid-Open Patent Application Publication No. 2005-79543, in a low-temperature film deposition process of depositing the TiN film by using $TiCl_4$ and $NH_3$ as source gases, chlorine is desorbed by displacing a Ti—Cl bond by a Ti—O bond by oxidizing the surface after depositing the Ti film in order to solve a problem in which the surface of the Ti film is etched and the film is stripped because impact of exposure of the surface of the Ti film to a $Cl_2$ gas or an HCl gas is larger than generation of the nitriding reaction when the Ti—Cl bond of the surface of the Ti film is displaced by a Ti—N bond by nitriding. Because the Ti—O bond is more stable than the Ti—N bond, the Ti—O bond has great corrosion resistance to the $Cl_2$ gas and the HCl gas and can prevent the corrosion caused by these gases. Accordingly, even the low-temperature Ti film deposition that increases a chloride concentration remaining in the film can prevent another film such as the TiN film deposited thereon later from stripping off therefrom. Although a resistance of the film is increased by the Ti—P bond after the oxidation, there is no problem because the Ti—O bond is displaced by the Ti—N bond by the subsequently performed nitriding process or TiN film deposition.

Moreover, as disclosed in Japanese Laid-Open Patent Application Publication No. 2012-184499, a method of manufacturing a semiconductor device is known in which a TiON film is deposited by supplying a $TiCl_4$ gas to a processing chamber accommodating a substrate therein, by depositing a TiN film on the substrate by repeating a cycle of supplying an $NH_3$ gas to the processing chamber a plurality of times, and by supplying an oxygen-containing gas to the processing chamber.

In this manner, in the disclosure of Japanese Laid-Open Patent Application Publication No. 2005-79543 and Japanese Laid-Open Patent Application Publication No. 2012-184499, the oxidation process is utilized to deposit the oxide film on the substrate as necessary in depositing the TiN film or TiON film.

In the meanwhile, recently, the TiN film is frequently utilized as an electrode of a capacitor and the like, and is frequently deposited by a film deposition process in a high temperature of 500 degrees C. or higher in order to reduce a film resistance. In such a high-temperature film deposition process, a grain diameter is likely to become larger than that in a low-temperature film deposition process due to an effect of annealing, and impurities are also likely to be released, which makes it possible to deposit a low resistance film.

However, such a high-temperature process has caused a new problem of an increase in released particles because the high-temperature process, as a result of an increase in grain diameter, has increased particles caused by being stripped off from the film deposited on a susceptor or an inner wall in the processing chamber and a stress of the film deposited on the susceptor or the inner wall. Such particles become foreign substances when falling on a wafer, and a quality of the film is deteriorated when a further film is deposited thereon.

SUMMARY OF THE INVENTION

Accordingly, embodiments of the present invention may provide a novel and useful method of depositing a film that can deposit a nitride film while reducing generation of particles in a chamber.

According to an embodiment of the present invention, there is provided a method of depositing a film. In the method, one operation of a unit of film deposition process is performed by carrying a substrate into a processing chamber, by depositing a nitride film on the substrate, and by carrying the substrate out of the processing chamber after finishing depositing the nitride film on the substrate. The one operation is repeated a predetermined plurality of number of times continuously to deposit the nitride film on a plurality of substrates continuously. After that, an inside of the processing chamber is oxidized by supplying an oxidation gas into the processing chamber.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 8 is a diagram for illustrating an example of a process flow of the method of depositing the film of the first embodiment of the present invention;

FIG. 10 is a chart showing an experimental result of the method of depositing the film of a working example 2 of the present invention;

DETAILED DESCRIPTION OF EMBODIMENTS

Figure 1:
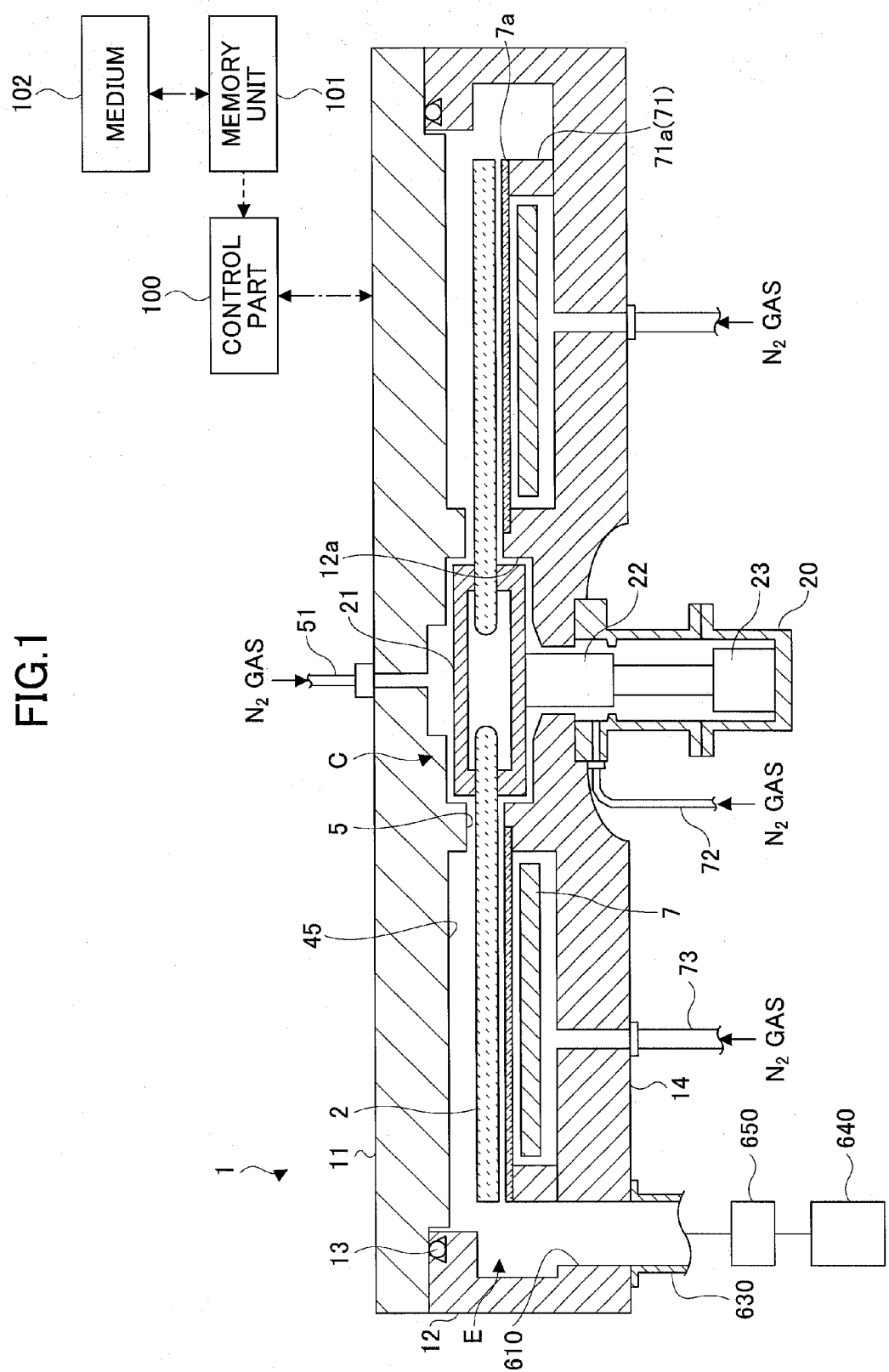
FIG. 1 is a cross-sectional view for illustrating an example of a film deposition apparatus preferable for performing a method of depositing a film of a first embodiment of the present invention.

A description is given below, with reference to accompanying drawings of non-limiting, exemplary embodiments of the present invention. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

[Film Deposition Apparatus]

Figure 2:
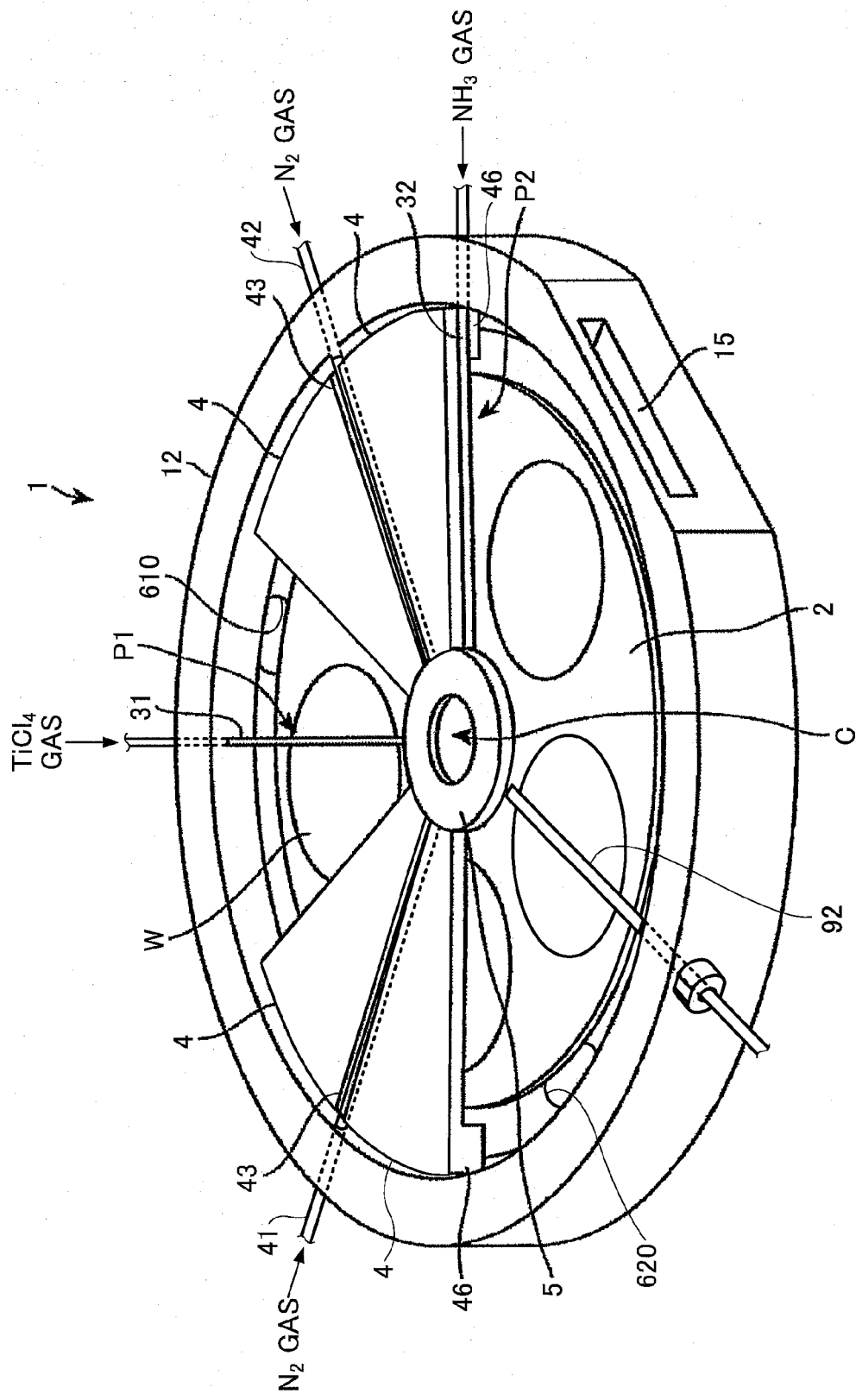
FIG. 2 is a perspective view for illustrating an example of the film deposition apparatus preferable for performing the method of depositing the film of the first embodiment of the present invention.
Figure 3:
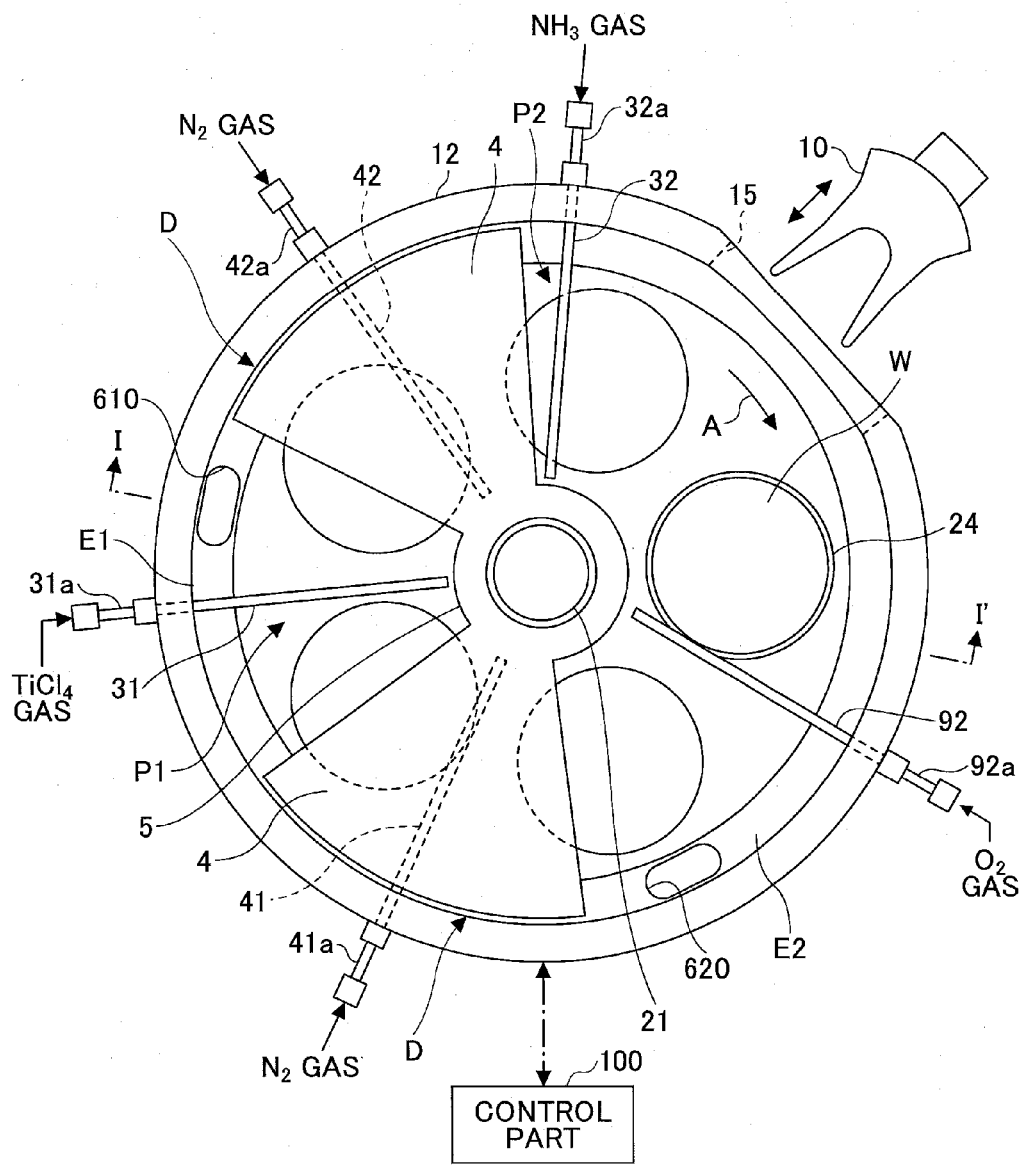
FIG. 3 is a plan view for illustrating an example of the film deposition apparatus preferable for performing the method of depositing the film of the first embodiment of the present invention.

FIG. 1 is a cross-sectional view of an exemplary film deposition apparatus preferable for performing a method of depositing a film of a first embodiment of the present invention. FIG. 2 is a perspective view of the exemplary film deposition apparatus suitable for performing the method of depositing the film of the first embodiment. FIG. 3 is a plan view for illustrating the exemplary film deposition apparatus preferable for performing the method of depositing the film of the first embodiment of the present invention.

To begin with, a description is given below of a film deposition apparatus preferable for performing the method of depositing the film of the embodiment. Referring to FIGS. 1 to 3, the film deposition apparatus of the embodiment includes a chamber 1 having a substantially circular shape in its plan view and a flattened shape in its side view, and a susceptor 2 having its rotational center in the center of the chamber 1. The chamber 1 includes a chamber body 12 having a bottomed cylindrical shape, and a ceiling plate 11, which is detachably provided on the upper surface of the chamber body 12 through a sealing, member 13 (see FIG. 1) such as an O-ring to hermetically seal the chamber 1.

The chamber 1 is a processing chamber to perform a film deposition process on a wafer W. Here, the chamber 1 may be made of a variety of materials, for example, aluminum (Al).

The susceptor 2 is fixed to a core portion 21 in a cylindrical shape at the center portion thereof. The core unit 21 is fixed to the upper end of a rotational shaft 22 extending in the vertical direction. The rotational shaft 22 penetrates through a bottom portion 14 of the chamber 1. The lower end of the rotational shaft 22 is attached to a drive part 23, which causes the rotational shaft (see FIG. 1) to rotate around the vertical axis of the rotational shaft 22. The rotational shaft 22 and the drive part 23 are accommodated in a cylindrical case body 20 whose upper surface is opened. A flange on the upper surface of the case body 20 is hermetically attached to the lower surface of a bottom portion 14 of the chamber 1 to maintain an airtight state between the inner atmosphere and the outer atmosphere of the case body 20.

As illustrated in FIG. 2 and FIG. 3, circular concave portions 24 for receiving a plurality of semiconductor wafers (which are hereinafter called "wafers"), which are a plurality of substrates (five substrates are illustrated in FIGS. 2 and 3), are formed in a surface of the susceptor 2 along a rotational direction (a circumferential direction) thereof. FIG. 3 illustrates a state where the wafer W is placed on only one circular concave portion 24 for convenience. The inner diameter of the circular concave portion 24 is slightly greater than the diameter of the wafer W by, for example, 4 mm. The depth of the circular concave portion 24 is substantially equal to the thickness of the wafer W or slightly deeper than the thickness of the wafer W. Accordingly, when the wafer W is accommodated in the circular concave portion 24, the height of the surface of the wafer W is substantially the same as the height of the surface of the susceptor in an area where the wafer is not placed or slightly lower than the height of the surface (an area where the wafer is not placed) of the susceptor 2. Through-holes (not illustrated), through which lift pins (not illustrated) for lifting up and down the back surfaces of the wafers W by supporting the back surfaces, penetrate through the bottom surfaces of the circular concave portions 24. For example, the number of the lift pins is three. The susceptor 2 may be made of a variety of materials, for example, quartz.

FIGS. 2 and 3 are diagrams illustrating the structure inside the chamber 1. For convenience, the ceiling plate 11 is omitted from illustration in FIGS. 2 and 3. As illustrated in FIGS. 2 and 3, a reaction gas nozzle 31, a reaction gas nozzle 32, separation gas nozzles 41 and 42, and an oxidation gas nozzle 92, which are made of, for example, quartz, are arranged above the susceptor 2 while interposing gaps in a circumferential direction of the chamber 1 (a rotational direction along an arrow A in FIG. 3 of the susceptor 2). In FIGS. 2 and 3, the separation gas nozzle 41, the reaction gas nozzle 31, the separation gas nozzle 42, the reaction gas nozzle 32, and the oxidation gas nozzle 92 are arranged in this order in a clockwise direction (the rotational direction of the susceptor 2) from a transfer opening 15 described below. These nozzles 31, 32, 41, 42 and 92 are attached to the chamber body 12 by fixing gas introducing ports 31a, 32a, 41a, 42a and 92a (see FIG. 3), which are base portions of the nozzles 31, 32, 41, 42 and 92, respectively, to the outer peripheral wall of the chamber body 12. Thus, these nozzles 31, 32, 41, and 42 are located so as to be introduced inside the chamber 1 from the outer peripheral wall of the chamber 1 and horizontally extend along a radial direction of the chamber body 12.

Among the above nozzles 31, 32, 41, 42 and 92, although the reaction gas nozzles 31 and 32 and the separation gas nozzles 41 and 42 are nozzles that are used during the film deposition process of the TiN film, the oxidation gas nozzle 92 is a nozzle that is used when the film deposition process is not performed. Hence, because the oxidation gas nozzle 92 does not directly get involved in the film deposition process, the oxidation gas nozzle 92 can be arranged at any position without being limited to the above-mentioned arrangement order of the nozzles 31, 32, 41, 42 and 92. More specifically, because the nozzle 92 is a nozzle that supplies an oxidation gas to the susceptor 2 when a wafer W is not placed on the susceptor 2 after the wafer W is carried out, the nozzle 92 can be arranged at a variety of positions as long as the surface of the susceptor 2 can be oxidized. A more detailed description is given later of the method of depositing the film including how to use the oxidation gas nozzle 92 according to the embodiment.

In the embodiment, the reaction gas nozzle 31 is connected to a supply source (not illustrated) of a titanium chloride ($TiCl_4$) gas through a pipe arrangement, a flow controller, or the like (not illustrated). The reaction gas nozzle 32 is connected to a supply source (not illustrated) of an ammonia gas through a pipe arrangement, a flow controller, or the like (not illustrated). The separation gas nozzles 41 and 42 are connected to a supply source (not illustrated) of a separation gas through a pipe arrangement, a flow controller, or the like (not illustrated). A noble gas such as helium (He), Argon (Ar) or the like or an inert gas such as a nitrogen ($N_2$) gas or the like can be used as the separation gas. In the embodiment, the $N_2$ gas is used. Moreover, the oxidation gas nozzle 92 is connected to a supply source (not illustrated) of an oxidation gas through a pipe arrangement, a flow controller, or the like (not illustrated). For example, a gas containing oxygen ($O_2$), ozone ($O_3$) and water ($H_2O$) are available for the oxidation gas. Furthermore, by providing a plasma generator near the oxidation gas nozzle 92, a plasma oxidation gas that is generated by converting the above gas containing oxygen ($O_2$), ozone ($O_3$) and water ($H_2O$) to plasma can be used.

A plurality of gas ejection holes 33 opening toward the susceptor 2 are arranged in the reaction gas nozzles 31 and 32 along the longitudinal directions of the reaction gas nozzles 31 and 32 at an interval of, for example, 10 mm. In an area below the reaction gas nozzle 31, there is a first process area P1 used to cause a $TiCl_4$ gas to adsorb on the wafer W. The lower area of the reaction gas nozzle 32 is a second process area P2 where the $TiCl_4$ gas adsorbing on the wafer W in the first process area P1 is nitrided. The oxidation gas nozzle 92 may be also provided in the second process area P2. Moreover, the oxidation gas nozzle 92 may also have a plurality of gas ejection holes opening toward the susceptor 2 and arranged along the longitudinal direction thereof at predetermined intervals.

Referring to FIGS. 2 and 3, two convex portions 4 are provided inside the chamber 1. The convex portions 4 are attached to the back surface of the ceiling plate 11 so as to protrude toward the susceptor 2 in order to form the separation areas D with the separation gas nozzles 41, 42. The convex portions 4 are described in detail later. Each convex portion 4 has a substantially sector form in its plan view with its apex cut in a circular arc shape. In this embodiment, an inner circular arc is connected to a ring-shaped protruding portion 5 (described later), and an outer circular arc is arranged along an inner peripheral surface of the chamber body 12 of the chamber 1.

Figure 4:
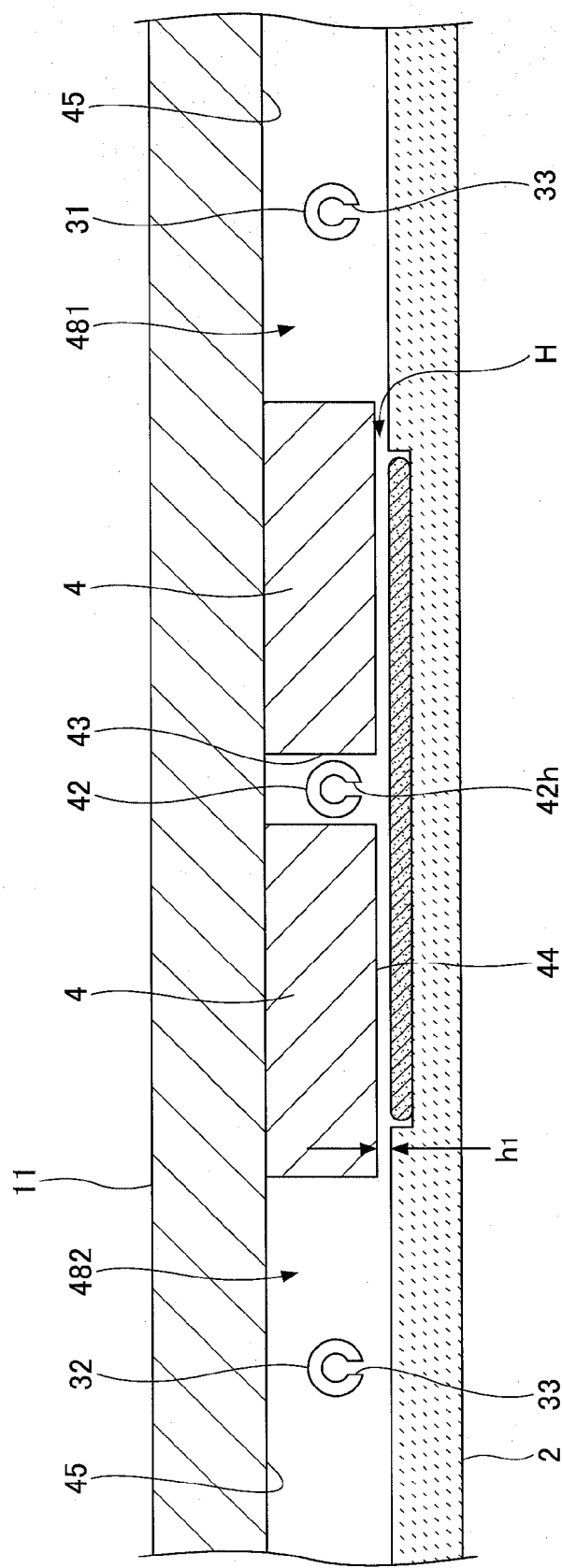
FIG. 4 is a cross-sectional view of a chamber along a concentric circle of a susceptor of an example of the film deposition apparatus preferable for performing the method of depositing the film of the first embodiment of the present invention.

FIG. 4 illustrates a cross section of the chamber 1 along a concentric circle of the susceptor 2 from the reaction gas nozzle 31 to the reaction gas nozzle 32. As illustrated, a convex portion 4 is attached to the back surface of the ceiling plate 11. There are a low ceiling surface 44 (a first ceiling surface), which is a lower surface of the convex portion 4, and a high ceiling surface 45 (a second ceiling surface), which is a higher surface of the convex portion 4 and is positioned on both sides of the low ceiling surface 44 in a circumferential direction. The low ceiling surface 44 is shaped like a sector having its apex cut so as to form like a circular arc in its plan view. Furthermore, as illustrated in FIG. 4, a groove portion 43 is formed in the middle of the convex portion 4 in its circumferential direction so as to extend in a radial direction. The separation gas nozzle 42 is accommodated inside the groove portion 43. Another groove portion 43 is similarly formed in another convex portion 4. The separation gas nozzle 41 is accommodated in the other groove portion 43. The reaction gas nozzles 31 and 32 are provided in spaces under the high ceiling surface 45. The reaction gas nozzles 31 and 32 are provided in the vicinity of the wafer W and apart from the ceiling surface 45. In addition, FIG. 4 illustrates a space 481 under the ceiling surface 45 where the reaction gas nozzle 31 is provided and a space 482 under the ceiling surface 45 where the reaction gas nozzle 32 is provided. The oxidation gas nozzle 92 maybe also provided in the space 482 (see FIG. 3).

A plurality of gas injection holes 42h (see FIG. 4) opening toward the susceptor 2 are provided in the separation gas nozzle 42, which is accommodated in the groove portion 43 of the convex portion 4. The gas injection holes 42h are arranged along the longitudinal direction of the separation gas nozzle 42 at an interval of, for example, 10 mm. Although it is not illustrated, the separation gas nozzle 41 is similar to the gas nozzle 42 in this regard.

A separation space H, which is narrow, is formed between the low ceiling surface 44 and the susceptor 2. When the $N_2$ gas is supplied from the gas ejection holes 42h of the separation gas nozzle 42, the $N_2$ gas flows toward the spaces 481 and 482 through the separation space H. At this time, because the volume of the separation space H is smaller than the volumes of the spaces 481 and 482, the pressure of the separation space H can be set relatively higher than the pressures in the spaces 481 and 482 by the $N_2$ gas. In other words, the separation space H having a high pressure is formed between the spaces 481 and 482. Moreover, the $N_2$ gas flowing from the separation space H to the spaces 481 and 482 functions as counter flows against the $TiCl_4$ gas from the first flow area P1 and the $NH_3$ gas from the second process area P2. Accordingly, the $TiCl_4$ gas from the first flow area P1 and the $NH_3$ gas from the second process area P2 are separated by the separation space H. Therefore, it is possible to prevent the $TiCl_4$ gas from the first process area P1 and the $NH_3$ gas from the second process area P2 from mixing and reacting with each other inside the chamber 1.

It is preferable to set the height hl of the ceiling surface 44 relative to the upper surface of the susceptor 2 suitable to make the pressure in the separation space H higher than the pressures in the spaces 481 and 482, considering the pressure inside the chamber 1 during the film deposition, the rotational speed of the susceptor 2, the supply amount of the separation gas (the $N_2$ gas), or the like.

As illustrated in FIGS. 2 and 3, a ring-shaped protruding portion 5 surrounding the outer periphery of the core portion 21, to which the susceptor 2 is fixed, is provided under the lower surface of the ceiling plate 11. The ring-shaped protruding portion 5 is continuously formed from the convex portions 4 at portions on a side of the rotation center of the convex portions 4. The lower surface of the ring-shaped protruding portion 5 has substantially the same height as that of the ceiling surface 44.

FIG. 1 is a cross-sectional view taken along a line I-I' of FIG. 3. FIG. 1 illustrates an area where the ceiling surface 45 is provided.

Figure 5:
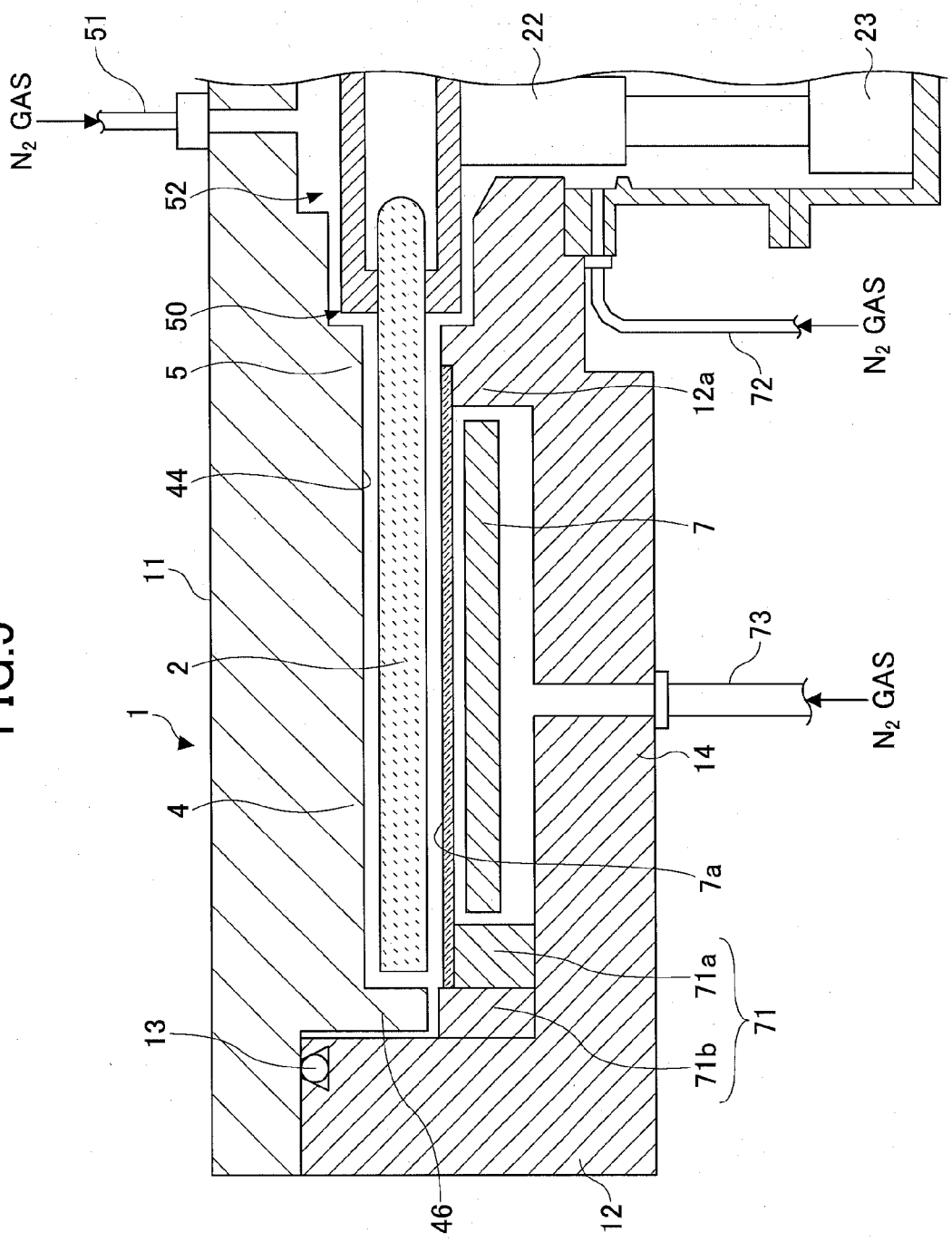
FIG. 5 is a partial cross-sectional view for illustrating an area provided with a ceiling surface of an example of the film deposition apparatus preferable for performing the method of depositing the film of an embodiment of the present invention.

On the other hand, FIG. 5 is a cross-sectional view of an area including the ceiling surface 44 of the film deposition apparatus 1. As illustrated in FIG. 5, a peripheral edge portion (a portion of the chamber 1 on the outer edge side) of the convex portion 4 shaped into a substantially sector form has a bent portion 46 bent in a L-like shape so as to face the outer end surface of the susceptor 2. The bent portion 46 prevents reaction gases from intruding from both sides of the separation area D to prevent both of the reaction gases from mixing with each other in a manner similar to the convex portion 4. The convex portion 4 shaped into the substantially sector form is provided on the ceiling plate 11. Because the ceiling plate 11 is detachable from the chamber body 12, there is a small gap between the outer peripheral surface of the bent portion 46 and the chamber body 12. A gap between the inner peripheral surface of the bent portion 46 and the outer edge surface of the susceptor 2 and a gap between the outer peripheral surface of the bent portion 46 and the chamber body 12 are set to have a dimension similar to, for example, that of a gap between the ceiling surface 44 and the upper surface of the susceptor 2.

As illustrated in FIG. 4, the inner peripheral wall of the chamber body 12 is formed to be a vertical surface approaching the outer peripheral surface of the bent portion 46. However, a portion of the inner peripheral wall of the chamber body 12 other than the separation area D is recessed toward the outer side from a part opposite to the outer end surface of the susceptor 2 to the bottom portion 14 as illustrated in FIG. 1. Hereinafter, for convenience of explanation, this recessed portion having a substantially rectangular shape in its cross-sectional view is referred to as an evacuation area E. Specifically, as illustrated in FIG. 3, the evacuation area communicating with the first process area P1 is referred to as a first evacuation area E1 and the evacuation area communicating with the second process area P2 is referred to as a second evacuation area E2. A first evacuation port 610 and a second evacuation port 620 are respectively formed in the bottom portions 14 of the first and second evacuation areas E1 and E2, as illustrated in FIGS. 1 through 3. Referring to FIG. 1, the first and second evacuation ports 610 and 620 are connected to, for example, a vacuum pump 640 that is an evacuating unit through exhaust pipes 630. FIG. 1 also illustrates a pressure controller 650.

As illustrated in FIGS. 1 and 5, a heater unit 7 that is a heating means is provided in a space between the susceptor 2 and the bottom portion 14 of the chamber 1. The wafer W on the susceptor 2 is heated up to a temperature determined in a process recipe (for example, 610° C.) through the susceptor 2. The heater unit 7 heats the wafer W placed on the circular concave portion 24 so as to have a predetermined temperature during the film deposition process while the wafer W is placed on the circular concave portion 24.

As illustrated in FIG. 5, on the lower side of the susceptor 2, a ring-like cover member 71 is provided to prevent the gas from intruding into a lower area under the susceptor 2 by separating an atmosphere across from an upper space above the susceptor 2 to the evacuation areas E1 and E2 from an atmosphere where the heater unit 7 is installed. The cover member 71 includes an inner member 71a provided in a position vertically corresponding to the outer edge portion of the susceptor 2 and to an outer peripheral side outside the outer edge portion of the susceptor 2, and an outer member 71b provided between the inner member 71a and the inner wall surface of the chamber 1. The outer member 71b is provided in the vicinity of the bent portion 46 formed on the outer edge portion of the convex portion 4 in the separation areas D under the bent portions 46. The inner member 71a surrounds the entire periphery of the heater unit 7 and is positioned under the outer edge portion of the susceptor 2 and a portion slightly outside the outer edge portion.

A part of the bottom portion 14 closer to the rotation center than the space where the heater unit 7 is arranged has the ring-shaped protruding portion 12a protruding upward so as to approach the core portion 21 provided on the lower surface of the susceptor 2 and in the vicinity of the center portion of the susceptor 2. A narrow space is provided between the ring-shaped protruding portion 12a and the core portion 21. A gap between the inner peripheral surface of a through-hole for the rotational shaft 22 penetrating through the bottom portion 14 and the rotational shaft 22 is small. The narrow space and the small gap communicate with the inside of the casing 20. A purge gas supply pipe 72 is provided in the case body 20 so that the $N_2$ gas that is the purge gas is supplied into the narrow space to purge the narrow space. In the bottom portion 14 of the chamber 1, a plurality of purge gas supply pipes 73 are provided under the heater unit 7 at intervals of a predetermined angle in the circumferential direction (only one purge gas supply pipe 73 is illustrated in FIG. 5) to purge a space where the heater unit 7 is arranged. Furthermore, a lid member 7a is provided between the heater unit 7 and the susceptor 2 to bridge and cover a gap between the inner peripheral wall of the outer member 71b (the upper surface of the inner member 71a) and the upper end portion of the ring-shaped protruding portion 12a along the circumferential direction in order to prevent the gas from intruding into an area in which the heater unit 7 is provided. The lid member 7a can be made of, for example, quartz.

A separation gas supply tube 51 is connected to a center portion of the ceiling plate 11 of the chamber 1. The separation gas of the $N_2$ gas is supplied to a space 52 between the ceiling plate 11 and the core portion 21. The separation gas supplied to the space 52 is discharged toward the periphery of the susceptor 2 along the surface on the side of a wafer receiving area of the susceptor 2 through a narrow gap 50 between the ring-shaped protruding portion 5 and the susceptor 2. The space 50 can be maintained to have a pressure higher than those of the spaces 481 and 482 by the separation gas. Therefore, it is possible to prevent the $TiCl_4$ gas supplied to the first process area P1 and the $NH_3$ gas supplied to the second process area P2 from being mixed with each other after passing through the center area C. That is to say, the space 50 (or the center area C) functions in a manner similar to the separation space H (or the separation area D).

As illustrated in FIGS. 2 and 3, a transfer opening 15 is formed in the side wall of the chamber 1 for transferring the wafer W, which is the substrate, between a transfer arm 10 provided outside the chamber 1 and the susceptor 2. The transfer opening 15 is opened and closed by a gate valve (not illustrated). The wafer W is transferred between the circular concave portion 24 that is the wafer receiving area of the susceptor 2 and the transfer arm 10 at a position facing the transfer opening 15. Furthermore, a lift pin (not illustrated) for lifting the wafer W from the back surface side to serve and receive the wafer W and a lifting mechanism (not illustrated) for lifting the lift pin (not illustrated) are provided at a portion of the susceptor 2 corresponding to the position where the wafer W is served and received. The lift pin penetrates through the circular concave portion 24 of the susceptor 2.

Moreover, as illustrated in FIG. 1, the film deposition apparatus according to the embodiment includes a control unit 100 constituted of a computer for controlling operations of the entire film deposition apparatus. A program to be executed by the film deposition apparatus under control of the control unit 100 is stored in a memory of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 by a predetermined reading device and is installed inside the control unit 100.

[Method of Depositing Film]

Figure 6:
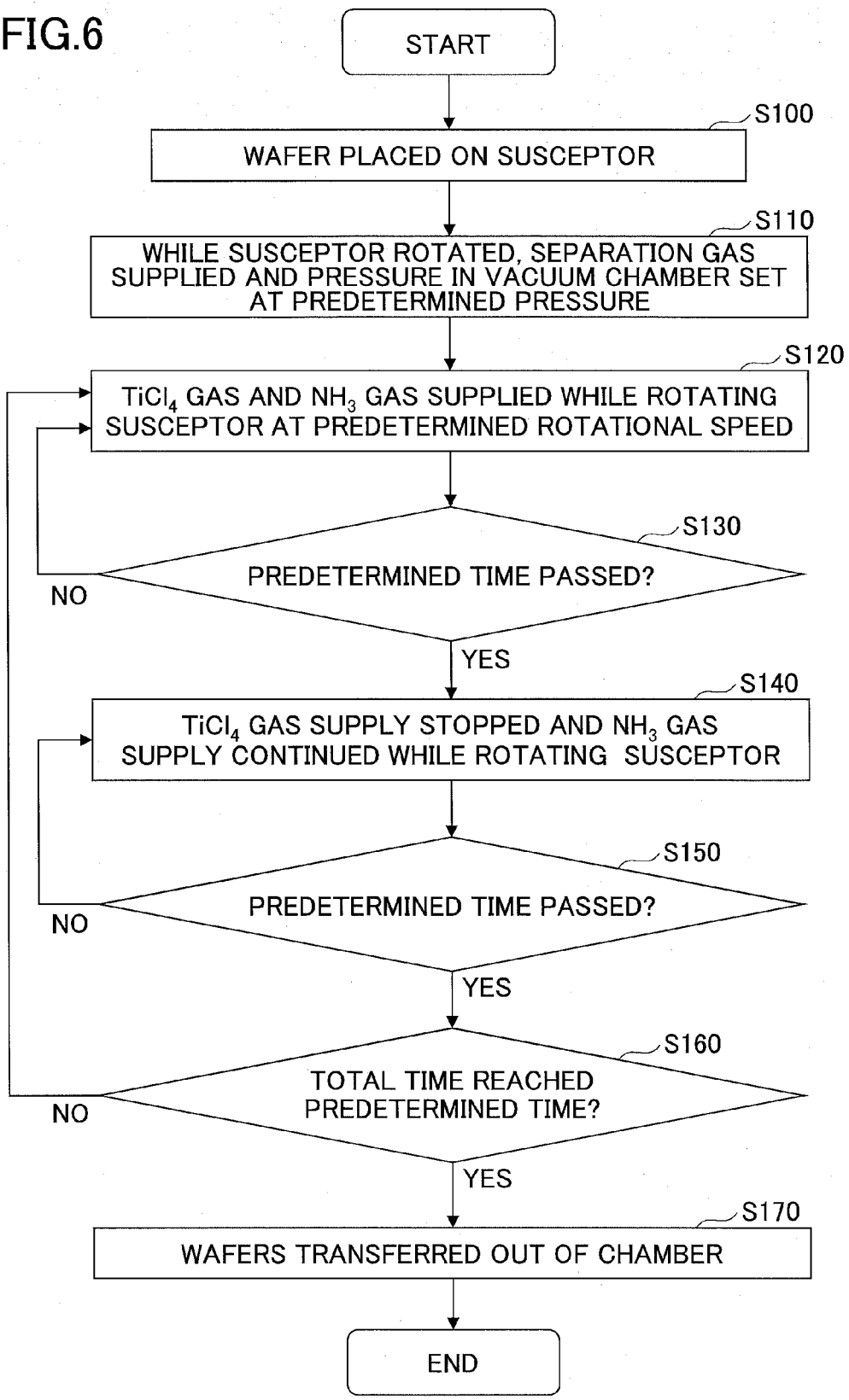
FIG. 6 is a diagram for illustrating a process flow of one operation of the method of depositing the film of an embodiment of the present invention.
Figure 7:
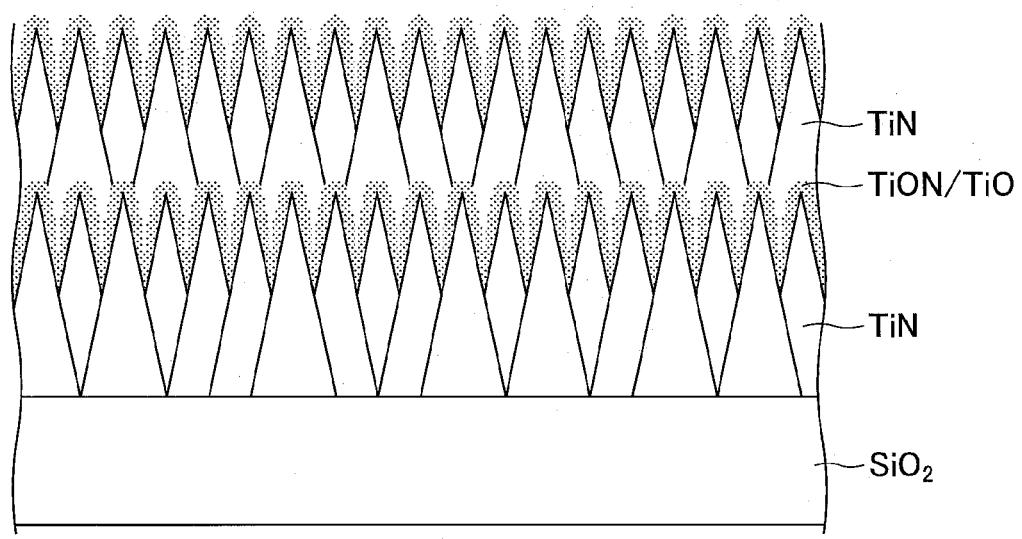
FIG. 7 is a view for explaining a principle of the method of depositing the film of the first embodiment of the present invention.

Referring to FIGS. 6 and 7, a description is given below of a method of depositing a film according to a first embodiment of the present invention. Hereinafter, a description is given by taking an example of using the above film deposition apparatus.

FIG. 6 is a diagram illustrating a process flow of one operation of the method of depositing the film of the first embodiment of the present invention. In the method of depositing the film of embodiment, a series of actions is defined as a unit of a film deposition process in which wafers W are carried into the chamber 1; a film deposition process on the wafers W is performed in the chamber 1; and the wafers W having been subjected to the film deposition process are carried out of the chamber 1. The processing unit is hereinafter called one operation or one run. In the method of depositing the film of the embodiment, after continuously repeating the film deposition process a predetermined number of times by continuously performing the one operation the predetermined number of times, the inside of the chamber 1 is oxidized by supplying an oxidation gas into the chamber 1 in a state without a wafer W inside the chamber 1. This prevents particles of a TiN film from being generated inside the chamber 1. Hence, the method of the embodiment more largely relates to matters about long continuous operations than those about the one operation, but because cause for particle generation and the like are involved in the content of the film deposition, at first, a description is given below of the content of the film deposition.

To begin with, in step S100, a wafer W is placed on the susceptor 2. More specifically, a gate valve (not illustrated) is opened, and the wafer W is transferred into the circular concave portion 24 of the susceptor 2 through the transfer opening (see FIGS. 2 and 3) from the outside by the transfer arm 10 (see FIG. 3). The transfer is performed by causing the not illustrated lift pin to move up and down from the bottom side of the chamber 1 through the through-hole formed in the bottom surface of the circular concave portion 24 when the circular concave portion 24 stops at a position facing the transfer opening 15. Such transfer of the wafer W is performed by intermittently rotating the susceptor 2, and the wafers W are placed on five of the circular concave portions 24 of the susceptor 2, respectively.

In step S110, the gate valve is closed, and after evacuating the chamber 1 up to a reachable vacuum degree by the vacuum pump 640, an $N_2$ gas is supplied at a predetermined flow rate from the separation gas nozzles 41 and 42. Moreover, an $N_2$ gas is also supplied from the separation gas supply pipe 51 and the purge gas supply pipes 72 at a predetermined flow rate. Following this, the pressure control unit 650 (see FIG. 1) controls the pressure in the chamber 1 so as to be a predetermined process pressure. Next, while rotating the susceptor 2 in a clockwise direction at a predetermined rotational speed, for example, a rotational speed of 240 rpm, the heater unit 7 heats the wafer W to a predetermined temperature, for example, a temperature of 610 degrees C.

In step S120, a $TiCl_4$ gas is supplied from the reaction gas nozzle 31 and an $NH_3$ gas is supplied from the reaction gas nozzle 32 (see FIGS. 2 and 3). The wafers W pass through the first process area P1, the separation area D (separation space H), the second process area P2, and the separation area D (separation space H) in this order by the rotation of the susceptor 2 (see FIG. 3). First, the $TiCl_4$ gas from the reaction gas nozzle 31 adsorbs on the wafers W in the first process area P1. Next, when the wafers W reach the second process area P2 after passing through the separation space H (separation area D) in an $N_2$ gas atmosphere, the $TiCl_4$ gas adsorbing on the wafers W reacts with the $NH_3$ gas from the reaction gas nozzle 32, and a TiN film is deposited on the wafers W. Furthermore, $NH_4Cl$ is generated as a by-product, released into a gas phase, and exhausted with the separation gas and the like. After that, the wafers W reach the separation area D (the separation space H in the $N_2$ gas atmosphere).

During this time, it is determined whether the supply of the $TiCl_4$ gas from the reaction gas nozzle 31 and of the $NH_3$ gas from the reaction gas nozzle 32 has been performed for a predetermined time period (step S130). The predetermined time period can be set based on a film thickness and the like of the TiN film to be deposited.

When the predetermined time period has not passed yet (step S130: NO), the film deposition of the TiN film is continued (step S120). When the predetermined time period has already passed (step S130: YES), the process advances to the next step S140.

In step S140, the rotation of the susceptor 2 and the supply of the $NH_3$ gas from the reaction gas nozzle 32 are continued, but the supply of the $TiCl_4$ gas from the reaction gas nozzle 31 is stopped. This causes the wafers W to be exposed to the $N_2$ gas (separation gas) and the $NH_3$ gas sequentially. In the deposited TiN film, unreacted $TiCl_4$ or a chlorine (Cl) generated by decomposition of the $TiCl_4$ is likely to remain. The unreacted $TiCl_4$ reacts with the $NH_3$ gas to generate the TiN, and the remaining Cl becomes the $NH_4Cl$ by reacting with the $NH_3$ gas and is released from the film. Because of this, impurities in the deposited TiN film are reduced, and the film property improves, which enables the resistivity thereof to decrease.

After starting step S140, it is determined whether the supply of the $NH_3$ gas from the reaction nozzle 31 has been performed for a predetermined time period (step S150). The predetermined time period may be properly set based on experiments and results thereof described later.

When the predetermined time period has not passed (step S150: NO), step S140 is continued. When the predetermined time period has passed (step S150: YES), the process goes to the next step S160.

In step S160, it is determined whether a total time period of the time period in step S130 and the time period in step S150 reaches a predetermined time period. When the total time period does not reach the predetermined time period (step S160: NO), the process returns to step S120, and the TiN film is further deposited. When the total time period reaches the predetermined time period, the supply of the $TiCl_4$ gas and the $NH_3$ gas is stopped, and the film deposition is finished.

In step S170, the wafers W are carried out of the chamber 1. The wafers W are carried out in a procedure opposite to that in carrying the wafers W into the chamber 1. More specifically, when one of the wafers W placed on the susceptor 2 comes to a position facing the transfer opening 15, the lift pins (not shown in the drawing) move up, and the transfer arm 10 (see FIG. 3) goes into the chamber 1 from outside to access the lifted wafer W, and carries the wafer W out of the chamber 1. This operation is performed for all of the wafers W while intermittently rotating the susceptor 2, and one operation is finished when all of the wafers W are carried out of the chamber 1.

After that, by repeating the same one operation, the film deposition process can be continuously performed on the wafers W.

Although the process flow of the one operation is described above, during the film deposition process, the TiN film is deposited on the susceptor 2 receiving the wafers W thereon as well as on the wafers W. Although the wafers W are carried out of the chamber 1 after the TiN film is deposited thereon at a predetermined thickness and the film deposition process is finished on the wafers W, the TiN film remains deposited on the susceptor 2 as long as the one operation is successively performed. In other words, the TiN film is deposited on the susceptor 2 much thicker than on the wafers W.

Such a TiN film on the susceptor 2 has a greater stress as its thickness grows thicker. Moreover, because the film deposition process of the TiN film is performed at a high temperature of 500 degrees C. or more such as 550 degrees C. or 610 degrees C., the TiN film having a grain diameter larger than a case of a low-temperature process is deposited due to an annealing effect. Such a factor has caused a problem of a part of the TiN film being stripped off from the susceptor 2 as fragments and falling on the wafers W by becoming particles (foreign substances, or dust). Furthermore, these particles are also thought to be generated from not only the surface of the susceptor 2 but also from the whole inner wall of the chamber 1 on which the TiN film is deposited.

Therefore, in the method of depositing the film in the first embodiment, after performing the one operation a predetermined number of times continuously, an oxidation process of supplying an oxidation gas into the chamber 1 is performed in a state without the wafers W in the chamber 1. By performing such an oxidation process, the surface of the TiN film deposited on the surface of the susceptor 2 is oxidized, and an extremely thin TiO film (or TiON film) is deposited, by which crystallinity between the existing TiN film and the next deposited TiN film can be divided. In addition, by inserting the thin TiO film between the TiN films, the stress of the TiN films can be relaxed, and generation of the particles can be reduced. In other words, by performing the oxidation process for oxidizing the inside of the chamber 1 every time the one operation of the TiN film deposition is continued a predetermined number of times, the TiN film deposited on the susceptor 2 can be divided with respect to each oxidation process, and the generation of particles can be prevented. This allows the number of operations capable of being continuously operated to increase in total, and a total throughput can be improved.

FIG. 7 is a diagram for explaining a principle of the method of depositing the film of the first embodiment of the present invention. In FIG. 7, a TiN film is deposited on a silicon oxide film $SiO_2$, and an extremely thin TiO film (or TiON film) is deposited on a surface of a columnar crystal of the bottom TiN film. This divides the TiN columnar crystals from each other, and prevents a single columnar crystal from continuously growing thick. Moreover, an extremely thin TiN film is also deposited on a surface of the second TiN film from the bottom, and can divide the crystallinity between the second TiN film and the third TiN film from the bottom even when the third TiN film from the bottom is deposited on the top of the second TiN film from the bottom. In this manner, by dividing the TiN film in a thickness direction, the stress generated inside the TiN film can be relaxed, and the particles generated from the fragments of the TiN film by being liberated from the surface of the TiN film can be reduced.

Here, the oxidation gas may be supplied from the oxidation gas nozzle 92 illustrated in FIGS. 2 and 3. As described above, because the location where the TiN film is deposited most thickly within the chamber 1 is the surface of the susceptor 2, supplying the oxidation gas to the susceptor 2 so as to face the susceptor 2 in the vicinity of the surface thereof is the most effective in order to supply the oxidation gas to the surface of the susceptor 2. Accordingly, as illustrated in FIGS. 2 and 3, the oxidation nozzle 92 is provided in a positional relationship similar to the reaction gas nozzles 31 and 32 and the separation gas nozzles 41 and 42 used during the film deposition relative to the susceptor 2, and at any position that does not interfere with the reaction gas nozzles 31 and 32 and the separation gas nozzles 41 and 42. In the examples illustrated in FIGS. 2 and 3, the oxidation gas nozzle 92 is arranged at a position apart from the reaction gas nozzle 32 within the second process area P2. Thus, by supplying the oxidation gas onto the susceptor 2 in almost the same conditions as those in the film deposition, because the oxidation gas is supplied to the TiN film slightly deposited on the other locations within the chamber 1 at almost the same degree of rate as that in the film deposition, the oxidation is thought to be performed at a proper level.

Here, the $TiO_2$ film deposited on the surface of the TiN film on the surface of the susceptor 2 is sufficient to be formed as a thin layer that cannot be described as a film, that is to say, a level of oxidizing the surface of the TiN film is enough. As long as the TiO film can divide continuity of the crystal of the TiN film between the upper position and the lower position, the TiO film can play its full part. Accordingly, slightly oxidizing the surface of the columnar crystal of the TiN film is sufficient. Hence, it can be said that providing a long oxidation process is not needed and there is no concern of reducing the total throughput.

Here, a variety of oxidation gases such as an $O_2$ gas, an $O_3$ gas, an $H_2O$ gas and the like can be used depending on the intended use, and even plasma gases converted therefrom can be used as the oxidation gas supplied from the oxidation gas nozzle 92 as long as the oxidation gas can oxidize the TiN film on the susceptor 2. However, considering the cost, the $O_2$ gas may be used as the oxidation gas because the $O_2$ gas is the least expensive.

Next, a description is given of a process flow of the method of depositing the film according to the first embodiment with reference to FIG. 8. FIG. 8 is a diagram illustrating an example of the method of depositing the film according to the first embodiment of the present invention.

In step S200, a coating process is performed. In the coating process, a TiN film is deposited on the surface of the susceptor 2 in a state in which a wafer W is not carried in the chamber 1. Because the TIN film is a reflective film, when the surface of the quartz susceptor 2 is uncovered, a temperature equilibrium state cannot be created. Therefore, the TiN film is deposited on the surface of the susceptor 2 before starting the film deposition on the wafers W, and the film deposition is started when the whole surface of the susceptor 2 is covered with the TiN film and goes into a state possible to keep the temperature equilibrium state. More specifically, while performing the processes of steps S110 through S130 in FIG. 6, the predetermined time period in step S130 just has to be changed into a time period for coating. Moreover, the rotational speed of the susceptor 2, the temperature, the pressure and the like in the chamber 1 may be made different values from those during the film deposition. Here, it is only necessary to perform the coating process only one time at the beginning of the continuous operations, and the coating process is not needed to be performed during the continuous operations hereinafter.

In step S210, one operation of the film deposition process is performed. More specifically, the process flow of the one operation described in FIG. 6 is performed. After finishing the one operation, the process goes to step S220. Here, because the one operation means a unit of process from carrying the wafers W into the chamber 1 to carrying the wafers W out of the chamber 1 after finishing the film deposition process, there is no wafer W in the chamber W after performing the one operation.

In step S220, it is determined whether the number of times of continuously performing the one operation at this time has reached a predetermined number of times. The predetermined number of times may be set in conformity with a film thickness desirable for the crystallinity of the TiN film deposited on the surface of the susceptor 2 to be divided, for example, may be set in a range of 5 to 20 times such as 10 times. Naturally, because the number of times of continuously repeating the one operation relates to the film thickness of the TiN film deposited in the film deposition process, a proper number of times can be set based on a relationship with the actual film deposition process.

In step S220, when the number of times of the continuous operations of the one operation does not reach the predetermined number of times, the process returns to step S210, and the one operation is continuously performed. Until reaching the predetermined number of times, the one operation in step S210 is repeated.

In step S220, when it is determined that the number of times of the one operation in the continuous operations has reached the predetermined number of times, the process advances to step S230.

In step S230, an oxidation process is performed. An oxidation gas such as an $O_2$ gas, an $O_3$ gas, an $H_2O$ gas or the like is supplied into the processing chamber 1 from the oxidation gas nozzle 92 in a state without a wafer W carried in the chamber 1, and the surface of the susceptor 2 is oxidized.

This causes the surface of the TiN film constituting a columnar crystal to be oxidized, and an extremely thin oxide film is deposited on the surface of the TiN film deposited on the surface of the susceptor 2.

Here, the oxidation process is preferred to be performed while rotating the susceptor 2 as well as the film deposition process. This is because the TiN film is deposited on the whole surface of the susceptor 2, and the whole surface of the susceptor 2 needs to be oxidized by supplying the oxidation gas to the whole surface of the susceptor 2. However, the rotational speed of the susceptor 2 is not necessarily set at a high speed such as 120 rpm or 240 rpm during the film deposition, but may be set in a range of 1 to 12 rpm, for example, 6 rpm. This is because the oxidation gas needs to be spread over the whole surface of the susceptor 2, and the low speed rotation causes the surface of the susceptor 2 to contact the oxidation gas more certainly (frequently) than the high speed rotation. Furthermore, with respect to the flow rate, a large quantity of oxidation gas does not need to be supplied, and for example, the flow rate may be set equal to or less than 10 slm such as 9 slm or 1 slm. In addition, the time period of the oxidation process does not have to be made long more than necessary, but may be made equal to or shorter than 120 seconds such as 60 seconds or 30 seconds. Because the whole surface of the susceptor 2 just has to be slightly oxidized, the oxidation process can be performed at the low flow rate, the short time and the low rotational speed. This makes it possible to divide the crystallinity of the TiN film on the susceptor 2, to reduce the film stress and to prevent the generation of the particles without losing time in the primary film deposition process. When the predetermined time period for the oxidation process to be performed has passed, the process goes to step S240.

In step S240, the one operation of the film deposition is performed. The process flow described in FIG. 6 is performed again. Here, a count of the number of times of the continuous operations to perform the oxidation process is reset, and the count begins from one again.

In step S250, it is determined whether the total number of times of the continuous operations at the time has reached a predetermined total number of times of the operations. The number of times of the continuous operations of the film deposition process is set at a number of times until cleaning the inside of the chamber 1 such as 1000 times (1000 operations), 1500 operations, and 800 operations. In other words, the total number of times of the continuous operations means a number of times that continues the continuous operations of the film deposition without performing the cleaning.

Here, when many particles are generated, the cleaning of the inside of the chamber 1 has to be performed to solve the condition. In the method of depositing the film according to the embodiment, it is possible to extend a time span of the cleaning by introducing the oxidation process every time the predetermined number of times of the continuous operations is performed so as to prevent the generation of the particles. Hence, the total number of times of the continuous operations can be set at a large number, which can improve the throughput.

In step S260, when the total number of times by that time has reached the preset total number of times of the operation, the process flow is finished. On the other hand, when the total number of times by that time does not reach the preset total number of times of the operation, the process returns to step S240, and the one operation of the film deposition process is performed.

Hereinafter, steps S240, S250 and S260 are repeated, and when the number of times of the continuous operations of the one operation after performing the oxidation process of S230 in step S250, the process returns to step S230 and the oxidation process is performed. When the oxidation process is performed, the count is reset, and the one operation is continuously performed again from step S240 while accumulating the count of the total number of times of the continuous operations.

Then, in step S260, when the total number of times of the continuous operations reaches the preset total number of operations (e.g., 1000 operations), the process flow finishes. After that, the inside of the chamber 1 is subjected to the cleaning process by using a fluorine-containing gas, for example, a $Cl_3F$ gas.

In this manner, after performing the operations of the continuous film deposition processes the predetermined number of times, by introducing the oxidation process for oxidizing the susceptor 2 in the chamber 1, the generation of the particles can be prevented and the total number of operations can be increased.

Here, the count and process of these operation numbers may be performed at the control part 100.

Moreover, in FIG. 8, the description is given by citing an example in which the number of times of the continuous operations of performing the oxidation process is constant, but the number of times of the continuous operations may be changed depending on stages. For example, the oxidation process is performed once every ten times of the film deposition processes until 500 operations, but setting the oxidation process once for every eight times of the film deposition processes after 500 operations is possible. For example, when increasing the number of times of the oxidation processes is better as the number of operations increases, such a setting change of the predetermined number of times during the continuous operations maybe performed. This makes it possible to set conditions suitable for a variety of processes, to prevent the generation of the particles and to increase the number of operations.

[Working Example]

Next, a description is given below of a working example in which the method of depositing the film according to the first embodiment was performed.

Figure 9B:
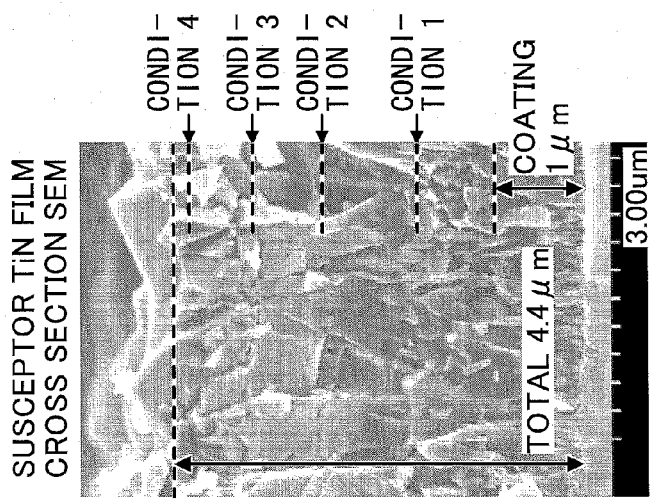
FIGS. 9A and 9B are charts showing an experimental result of the method of depositing the film of a working example 1 of the present invention.
Figure 9A:
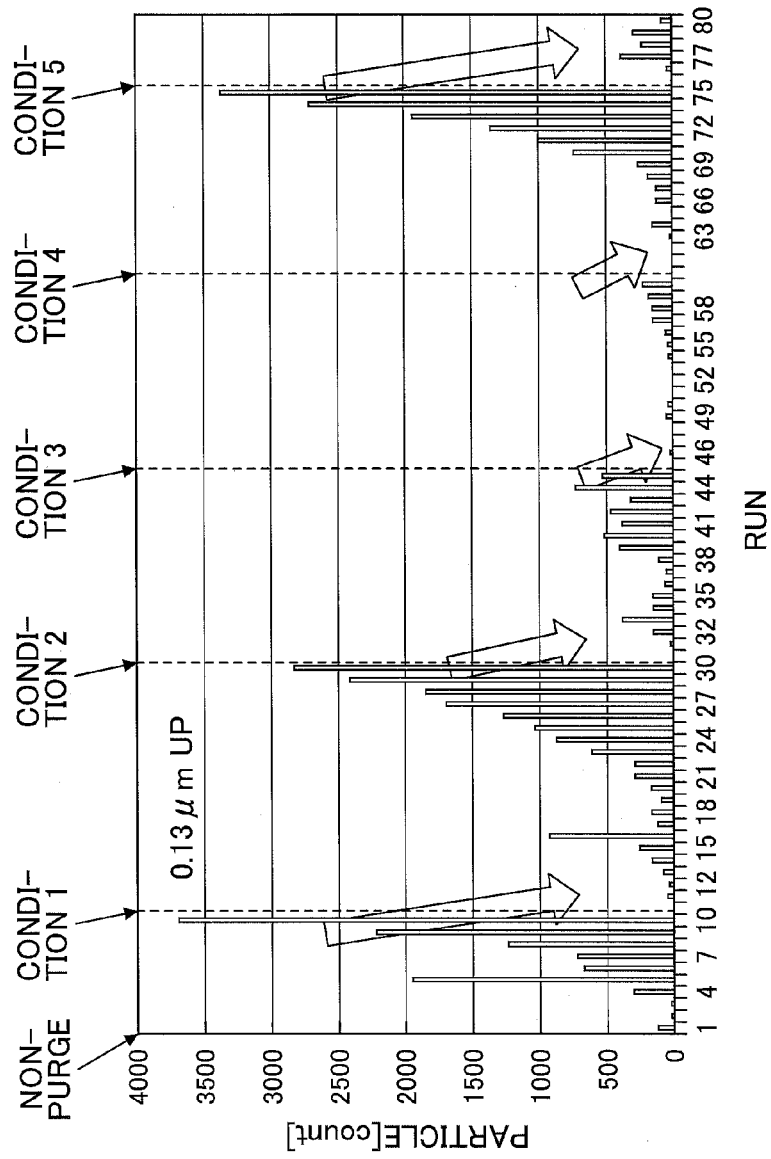

FIGS. 9A and 9B are charts showing results of practicing a method of depositing a film of a working example 1 of the present invention. FIG. 9A is a graph showing the results of practicing the working example 1 of the present invention. In the working example 1, conditions 1 through 5 were set and the method of depositing the film introducing the oxidation process was practiced. More specifically, the conditions of the oxidation were set at 1 through 5, and the oxidation process for oxidizing the susceptor was performed once every 10 through 20 operations (ten rotations constitute one operation). Respective conditions are shown below. Here, a flow rate, a rotational speed, a pressure and a time mean an oxidation gas, a rotational speed of a susceptor, a pressure inside the chamber, and a time period of the oxidation process, respectively.

Condition 1: flow rate 9 slm, rotational speed 6 rpm, pressure 2 Torr, and time 60 seconds;

Condition 2: flow rate 9 slm, rotational speed 6 rpm, pressure 2 Torr, and time 30 seconds;

Condition 3: flow rate 1 slm, rotational speed 6 rpm, pressure 2 Torr, and time 30 seconds;

Condition 4: flow rate 9 slm, rotational speed 120 rpm, pressure 2 Torr, and time 30 seconds;

Condition 5: flow rate 1 slm, rotational speed 120 rpm, pressure 2 Torr, and time 30 seconds;

In FIG. 9A, a vertical bar graph shows a number of generation of particles, and a horizontal axis shows a number of operations. Moreover, in FIG. 9A, dashed lines show timing of having performed the oxidation processes. FIG. 9A has shown that the number of particles drastically decreased in the next operations when the oxidation processes were performed at the time when the number of particles was gradually increasing. Thus, the graph shows that the generation of the particles can be certainly prevented by performing the oxidation processes at proper timing.

In contrast, comparing the effects of the oxidation processes between the conditions to each other from reduction rates of the particles of FIG. 9A, the graph shows that the number of particles decreases best after the oxidation process of the condition 3, which has the best particle prevention effect. The condition 3 has the flow rate of the oxidation gas of 1 slm, which is lower than 9 slm, the rotational speed of 6 rpm, which is much slower than 120 rpm, and the time period of 30 seconds, which is shorter than 50 seconds. Hence, the results of the example show that performing the oxidation process at the low flow rate and the low rotational speed and for the short time is effective, and preferable in terms of costs and throughput.

Accordingly, from the results of the working example 1, the flow rate of the oxidation gas of the method of depositing the film of the embodiment may be set in a range of 1 to 10 slm, preferably 1 to 9 slm, further preferably 1 to 5 slm. Furthermore, the rotational speed of the susceptor may be set in a range of 1 to 240 rpm, preferably 1 to 120 rpm, further preferably 1 to 20 rpm, even further preferably 1 to 6 rpm. In addition, the time period may be set in a range of 1 to 120 seconds, preferably 1 to 60 seconds, further preferably 1 to 30 seconds.

FIG. 9B is a cross-sectional photograph of a TiN film on the susceptor taken by a SEM (Scanning Electron Microscope) of the results of the method of depositing the film according to the working example 1. As shown in FIG. 9B, it is found that columnar crystals of the TiN film were divided in the vicinity of the conditions 1 through 5.

Thus, the photograph shows that the crystallinity of the TiN film can be divided by thin TiO films (or TiON films) by oxidizing the TiN film on the susceptor at proper timing.

FIG. 10 is a chart showing results of practicing a method of depositing a film of a working example 2 of the present invention. In the working example 2, the results have been shown in which oxidation processes were performed with annealing after performing film deposition processes of TiN films, and stresses of the TiN films after the oxidation processes were compared to those before the oxidation processes. Here, the oxidation processes were performed under conditions where the oxidation gas was an $O_2$ gas and the oxidation time periods were made 300 seconds, 600 seconds, and 1095 seconds, conditions where the oxidation gas was an $O_3$ gas and oxidation time periods were made 300 seconds and 600 seconds, and conditions where the oxidation gas was plasma and the oxidation time period was made 300 seconds, respectively. Here, the annealing temperature was 300 degrees C. for all cases.

As illustrated in FIG. 10, the stresses A of the TiN films after the oxidation were lower than the stresses B of the TiN films immediately after the film deposition. Hence, the chart shows that the stresses of the TiN films were relaxed by oxidizing the surfaces of the TiN films.

Moreover, comparing the results within FIG. 10, reduction rates of the stresses were great when the $O_3$ gas was used as the oxidation gas. Hence, the chart shows that the reduction effect of the stresses increases by using an oxidation gas that has strong oxidation power. Accordingly, for example, the $O_3$ gas may be used as the oxidation gas so as to use the oxidation gas having stronger oxidation power. However, because what oxidation gas is selected needs to consider not only such a stress reduction effect but also costs and the like, the oxidation gas may be arbitrarily selected depending on the intended use.

Figure 11:
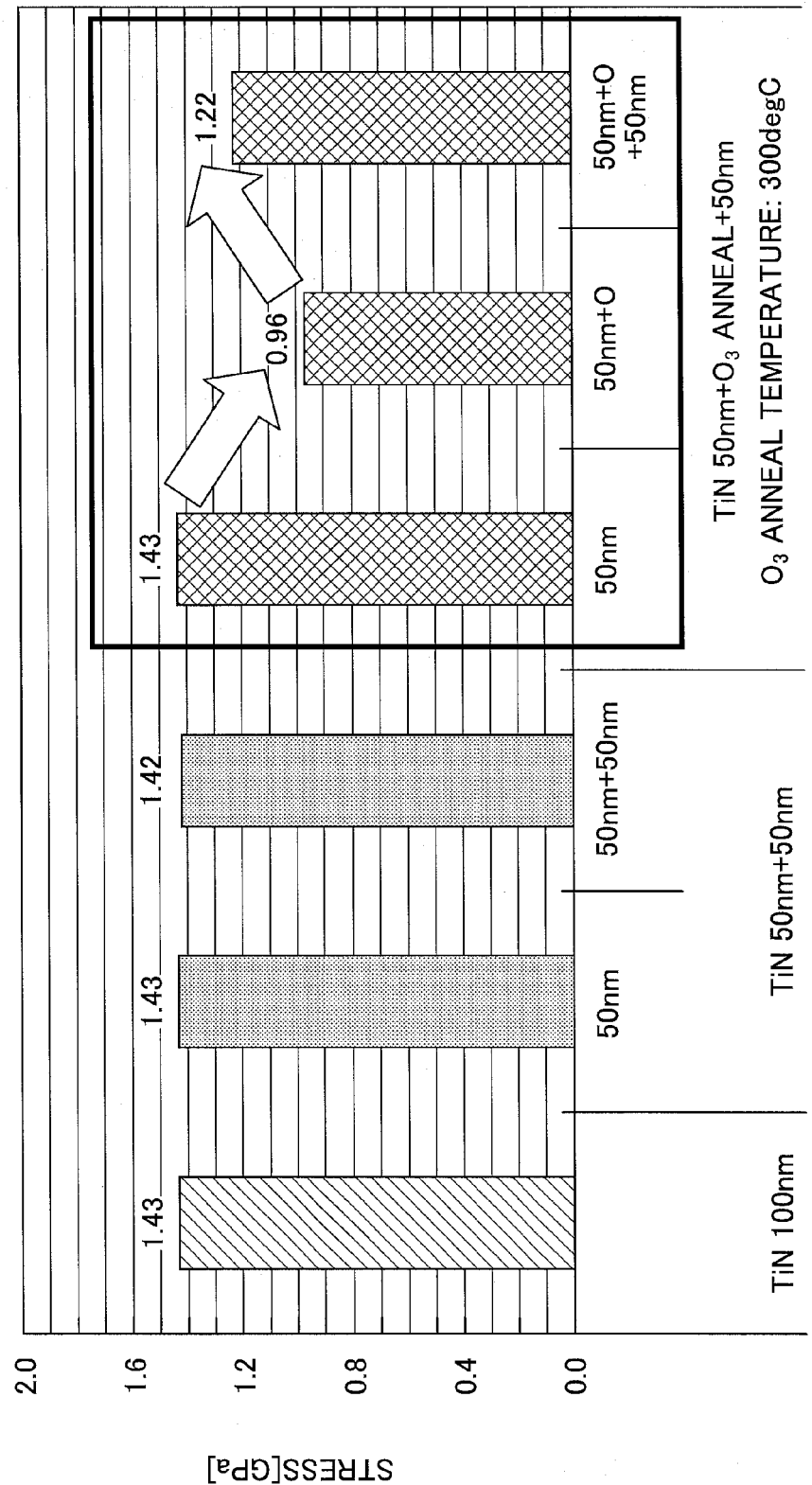
FIG. 11 is a chart showing an experimental result of the method of depositing the film of a working example 3 of the present invention.

FIG. 11 is a chart showing results of practicing a method of depositing a film according to working example 3. In the working example 3, influences of performing the oxidation processes on the stresses of the TiN films were measured. In FIG. 11, the leftmost bar graph shows a stress when a TiN film was deposited 100 nm in thickness. The second left bar graph shows a stress when a TiN film was deposited 50 nm in thickness. The third left bar graph shows a stress when a TiN film was deposited 100 nm in thickness in total by depositing the TiN film 50 nm in thickness before carrying the wafer out of the chamber and then by depositing the TiN film 50 nm in thickness thereon. The TiN films that did not go through these oxidation processes all have a stress of 1.43 GPa or 1.42 GPa, and all of the films showed almost similar results.

On the other hand, the right three values show results of stress variations when surfaces of TiN films with a thickness of 50 nm were oxidized. The third right bar graph corresponds to the TiN film with a thickness of 50 nm that did not go through the oxidation process, and a stress of this film was 1.43 GPa equal to the second left TiN film.

The second right value was a stress of the TiN film when the TiN film was oxidized by being annealed at 300 degrees C. by using an $O_3$ gas, and the stress was 0.96 GPa, which decreased widely.

The rightmost value was a measurement result of a stress of a whole film after depositing a TiN film 50 nm in thickness on a TiN film with a thickness of 50 nm whose surface was oxidized. This value is 1.22 GPa, which is higher than the second right result but lower than the third right result of the TiN film with a thickness of 50 nm that did not go through the oxidation process.

Accordingly, these results show that the stress of the TiN film can be reduced by oxidizing and annealing the TiN film and the stress can be more widely reduced than the film made of only the TiN film by inserting the thin TiO film (or TiON film) to be oxidized and annealed between the TiN films.

Thus, the results of the working examples show that the stress of the TiN film can be relaxed and the generation of the particles can be reduced according to the method of depositing the film of the first embodiment.

[Second Embodiment]

In the first embodiment, the description is given by citing the example of applying the method of depositing the film of the present invention to the ALD film deposition apparatus, but the method of depositing the film of the present invention can be applied to other film deposition apparatuses.

In the second embodiment, a description is given below of an example of applying the method of depositing the film of the present invention to a CVD (Chemical Vapor Deposition) apparatus.

Figure 12:
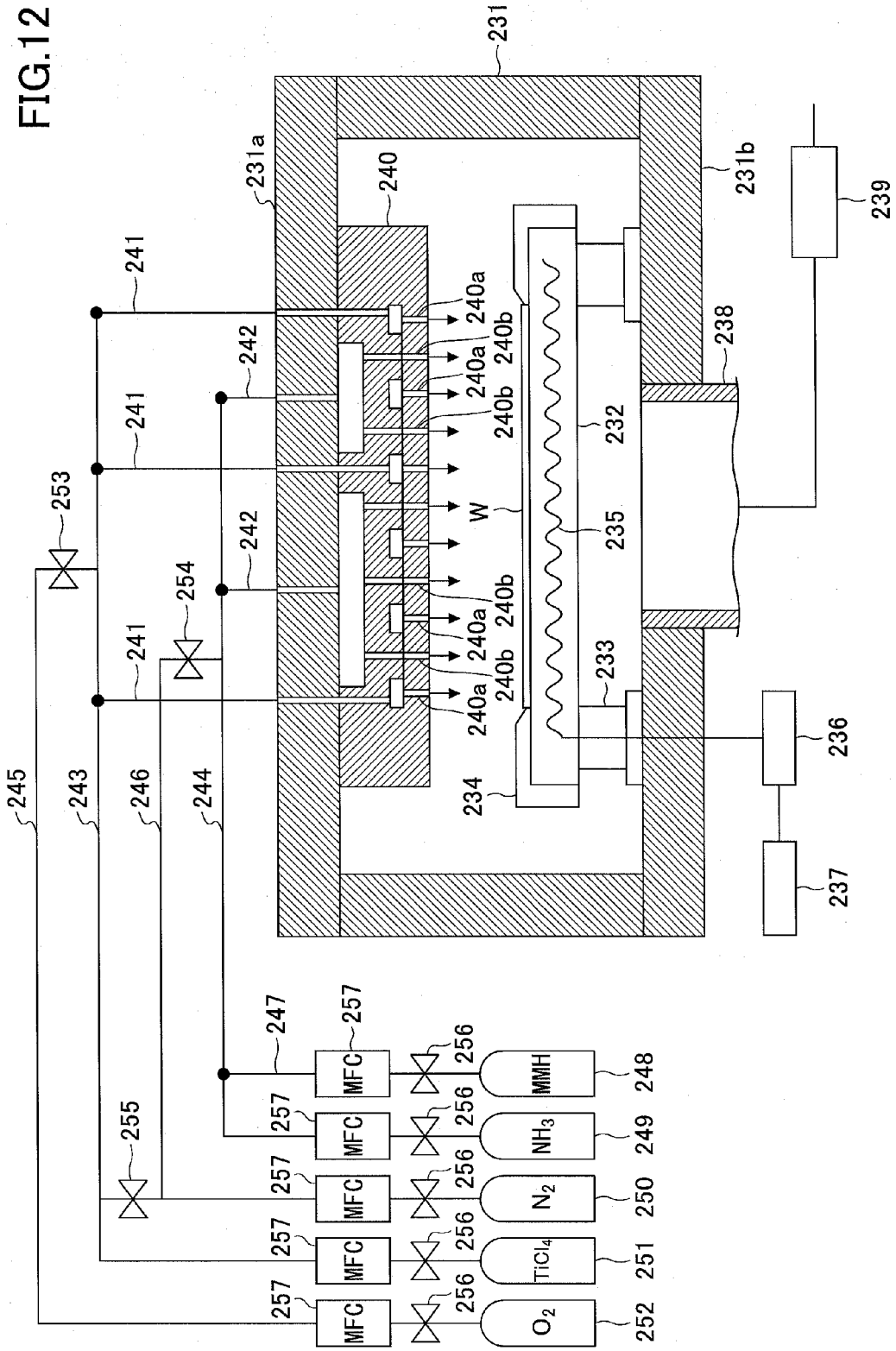
FIG. 12 is a cross-sectional view for illustrating an example of a TiN film deposition apparatus using CVD that can perform the method of depositing the film of a second embodiment of the present invention.

FIG. 12 is a cross-sectional view illustrating an example of a TiN film deposition apparatus using CVD that can implement a method of depositing a film of a second embodiment of the present invention. This film deposition apparatus includes an approximately cylindrical chamber 231 having an airtight structure, in which a susceptor 232 for holding a semiconductor wafer W, which is an object to be processed, is arranged by being supported by a cylindrical supporting member 233. A guide ring 234 is provided on a periphery of the susceptor 232 to guide the semiconductor wafer W. Moreover a heater 235 is embedded in the susceptor 232, and the heater 235 heats the semiconductor wafer W of the object to be processed up to a predetermined temperature by being fed from a power source 236. A controller 237 is connected to the power source 236, by which an output of the heater 235 is controlled depending on a signal of a temperature sensor (which is not shown in the drawing).

There is a shower head 240 provided on a lower surface of a ceiling wall 231a of the chamber 231. The shower head 240 includes a plurality of gas ejection holes 240a and 240b formed alternately therein. A $TiCl_4$ source 251 is connected to the gas ejection holes 240a through a pipe arrangement 243 and a pipe arrangement 241 diverging therefrom, and an $NH_3$ source 249 is connected to the gas ejection holes 240b through a pipe arrangement 244 and a pipe arrangement 242 diverging therefrom. In other words, the shower head 240 is a matrix type and adopts a post mix method that discharges a $TiCl_4$ gas and an $NH_3$ gas from different eject holes formed alternately and causes the $TiCl_4$ gas and the $NH_3$ gas to be mixed after being discharged.

Moreover, a pipe arrangement 245 connected to an $O_2$ source 252, which is an oxidation gas source, is connected to the pipe arrangement 243, and the $O_2$ gas of the oxidation gas is supplied into the chamber 231 through a pipe arrangement 241 and the eject holes 240a by switching a valve 253. On the other hand, a pipe arrangement 246 connected to an $N_2$ source 250 is connected to the pipe arrangement 244, and the $N_2$ gas is supplied into the chamber 231 through a pipe arrangement 244 and the eject holes 240b by switching a valve 254. In addition, the pipe arrangement 246 of the $N_2$ gas is also connected to the pipe arrangement 243 through a valve 255. Moreover, a pipe arrangement 247 extending from an MMH gas source 248 is connected to the pipe arrangements 244, and an MMH gas can be supplied into the chamber 231 from the gas eject holes 240b through the pipe arrangement 244 and 242. Here, the pipe arrangements from respective gas sources include valves 256 and mass flow controllers 257 provided therein.

An exhaust pipe 238 is connected to a bottom wall 231b of the chamber 231, and a vacuum pump 239 is connected to the exhaust pipe 238. The chamber 31 can be evacuated to a predetermined degree of vacuum by actuating the vacuum pump 239. Here, for example, the $N_2$ gas can be supplied into the chamber 231 as a purge gas from a purge gas supply source.

In order to deposit a TiN film by this apparatus, to begin with, a semiconductor wafer W is carried into the chamber 231, and the chamber is evacuated by the vacuum pump 239 to make a high degree of vacuum while the heater 235 heats the wafers W. Subsequently, an $N_2$ gas and an $NH_3$ gas are introduced into the chamber 231 at predetermined flow rates, for example, the $N_2$ gas in a range of 50 to 500 sccm, and the $NH_3$ gas in a range of 200 to 400 sccm so as to make the inside of the chamber 231 the pressure in a range of 1 to 10 Torr, and a pre annealing is performed. Next, the inside pressure of the chamber 231 is made in a range of 0.1 to 1 Torr, and the $TiCl_4$ gas is preliminarily supplied at a flow rate of, for example, 5 to 20 sccm for 5 to 20 seconds while maintaining the flow rate of $N_2$ gas and the $NH_3$ gas, the film deposition of the TiN film is subsequently performed in the same conditions for a predetermined time period. Here, while the semiconductor wafer is carried into the chamber 231 and the film deposition is finished, for example, an $N_2$ gas is preferably supplied as a purge gas at a predetermined flow rate. Moreover, the $NH_3$ gas and the MMH gas may be used concurrently.

After finishing depositing the film, a post-annealing is performed in an $NH_3$ atmosphere. Furthermore, the post-annealing may be performed in an inactive gas atmosphere. $N_2$, Ar, He and the like can be used as the inactive gas. An effect of stabilizing a TiN columnar crystal is added by the annealing of the inactive gas. In this case, a short time equal to or less than 30 seconds is sufficient for the annealing time period. After that, the semiconductor wafers are carried out of the chamber 231.

In the TiN film deposition apparatus using the CVD of the second embodiment, one operation for depositing the TiN film is performed as discussed above.

The method of depositing the film of the first embodiment can be applied to a process flow other than the one operation as it is. More specifically, the process flow described in FIG. 8 is applied thereto as it is. Here, the supply of the oxidation gas in the oxidation process is performed from an $O_2$ gas source 252. Another gas such as $O_3$ gas or the like other than the $O_2$ gas may be used as the oxidation gas as well as the method of depositing the film of the first embodiment.

In addition, the coating process of step S200 described in FIG. 8 just has to be performed as necessary, and is not required. Because the other substance is the same as that in the first embodiment, the description is omitted.

According to the method of depositing the film of the second embodiment, even when using the film deposition apparatus using the CVD, the crystallinity of the TiN film deposited on the susceptor can be divided and the generation of the particles can be reduced.

[Third Embodiment]

In a method of depositing a film according to a third embodiment of the present invention, a description is given below of an example of depositing the film by using a heat treatment apparatus.

To begin with, a description is given of the heat treatment apparatus that can practice the method of depositing the film according to the third embodiment.

Figure 13:
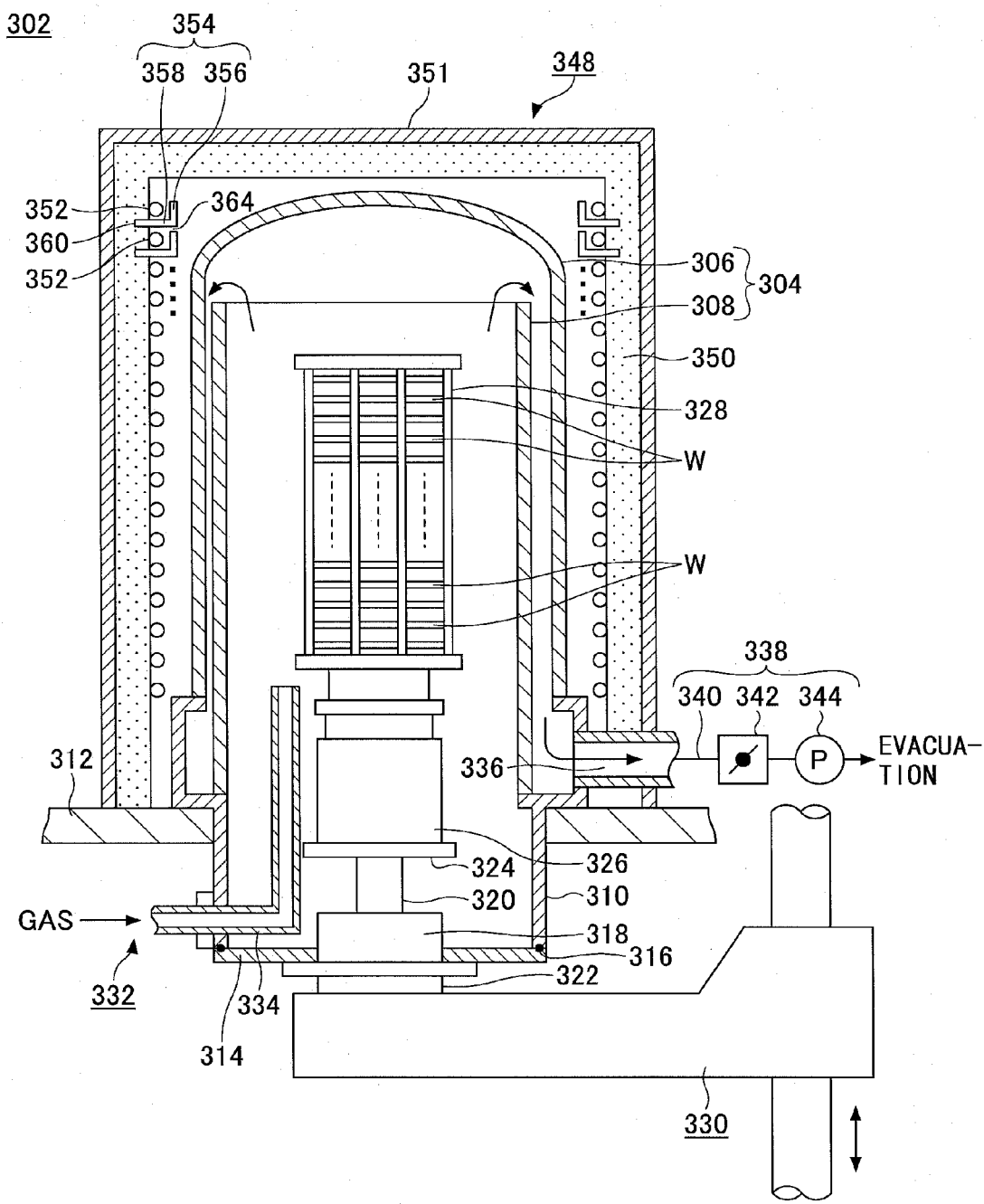
FIG. 13 is a schematic configuration diagram for illustrating an example of a heat treatment apparatus that can perform the method of depositing the film of a third embodiment of the present invention.

FIG. 13 illustrates a schematic configuration diagram of an example of the heat treatment apparatus that can practice the method of depositing the film of the third embodiment of the present invention. Here, in the embodiment, a description is given of an example of a vertical heat treatment apparatus that can accommodate a plurality of semiconductor wafers therein and perform a film deposition process on the wafers all together.

As illustrated in FIG. 13, a vertical heat treatment apparatus 302 includes a processing chamber 304 having a longer dimension in the vertical direction than in the horizontal direction. The processing chamber 304 is configured to have a double tube structure, for example, to include an outer cylinder 306 having a ceiling and an inner cylinder 308 arranged concentrically to and inside the outer cylinder 308.

The outer cylinder 306 and the inner cylinder 308 are made of a heat resisting material such as quartz. The lower ends of the outer cylinder 306 and the inner cylinder 308 are held by a manifold 310 made of stainless steel or the like. The manifold 310 is fixed to a base plate 312. Here, the whole processing chamber 304 may be configured to be made of, for example, quartz without providing the manifold 310.

A disk-shaped cap part 314 made of, for example, stainless steel is installed to an opening portion of the lower end of the manifold 310 through a seal member 316 such as an O-ring to be able to seal the opening hermetically. Moreover, a rotational shaft 320 rotatable in a sealed state by, for example, a magnetic fluid seal 318, is inserted into the central part of the cap part 314. The lower end of the rotational shaft 320 is connected to a rotational mechanism 322, and a table 32, for example, made of stainless steel, is fixed to the upper end of the rotational shaft 320.

A heat insulating cylinder, for example, made of quartz, is installed on the table 324.

For example, 50-150 semiconductor wafers W of objects to be treated are accommodated in a wafer boat 328 at predetermined intervals, for example, at about 10 mm intervals. The wafer boat 328, the table 324 and the cap part 314 are loaded into and unloaded from the processing chamber 304 in an integrated manner by, for example, a lifting mechanism of a boat elevator.

A gas introduction unit 332 is provided in a lower part of the manifold 310 to introduce a process gas into the processing chamber 304. The gas introduction unit 332 includes a gas nozzle 334 provided so as to penetrate the manifold 310.

Here, in FIG. 13, although only a single gas introduction unit 332 is illustrated, in fact, a plurality of gas introduction units 332 is arranged along a circumferential direction of the processing chamber 304. In order to implement the method of depositing the film of the embodiment of the present invention, because at least three kinds of gases of a $TiCl_4$ gas, a $NH_3$ gas and an oxidation gas such as an $O_3$ gas needs to be introduced into the processing chamber 304, at least three of the gas introduction units 332 are provided. Moreover, a flow rate of the gas introduced from the gas nozzle 334 to the processing chamber 304 is controlled by a flow rate control mechanism (which is not illustrated in the drawing).

A gas outlet 336 is provided on the upper side of the manifold 310, and is coupled to an exhaust system 338. The exhaust system 338 includes an exhaust passage 340, a pressure control valve 342 and a vacuum pump 344 serially connected to intermediate locations of the exhaust passage 342. An atmosphere in the processing chamber 304 can be exhausted while controlling the pressure therein by the exhaust system 338.

A heater apparatus 348 is provided so as to enclose the processing chamber 304 on the outer circumferential side of the processing chamber 304 to heat the objects to be treated such as the wafers W.

In such a heat treatment apparatus 302, the plurality of wafers W is placed in the wafer boat 328; the cap part 314 of the processing chamber 304 is opened and closed; and the wafer boat 328 is carried into and out of the processing chamber 304 by using the lifting mechanism 330.

The film deposition of the TiN film is performed by introducing the gases from the gas introduction units 332 into the processing chamber 304 through the gas nozzles 334. Moreover, at this time, the processing chamber 304 is heated by using the heater apparatus 348, and the TiN films are deposited on the many wafers W.

In this manner, the process flow in FIG. 8 described in the first embodiment can be applied to the heat treatment apparatus 302 that deposits the TiN film. In other words, the batch film deposition of the TiN film is continuously repeated predetermined times; the wafer boat 328 is introduced into the processing chamber 304 in a state without the wafers W placed therein; and the oxidation gas such as the $O_2$ gas is introduced into the processing chamber 304 through the gas introduction unit 332 in the state, by which the inside of the processing chamber 304 is oxidized. This causes the TiN film deposited on the wafer boat 328 or the surface of the processing chamber 304 to be oxidized, which can divide the crystallinity of the TiN film and prevent the generation of the particles.

Because the other description is the same as the method of depositing the film, the description is omitted.

According to the method of depositing the film of the third embodiment of the present invention, in the film deposition of the TiN film, the crystallinity of the TiN film on the wafer boat and the inside wall of the processing chamber can be divided, and the generation of the particles can be prevented.

Here, in the first through third embodiments, although the description is given by citing an example of depositing the TiN film, the method of depositing the film of the embodiments of the present invention can be applied to a variety kinds of film deposition except for the film deposition of the oxidation film because the crystallinity of the deposited film inside the processing chamber such as one on the susceptor only has to be able to be divided by performing the oxidation process inside the processing chamber at proper timing between the continuous operations of the film deposition. More specifically, the method can be also applied to a film deposition of a nitride film containing an element other than Ti, for example, a TaN film.

According to the embodiments of the present invention, the generation of the particles can be prevented when depositing a nitride film.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A method of depositing a film, the method comprising a step of:

performing one operation of a unit of a film deposition process by carrying a substrate into a processing chamber, by depositing a nitride film on the substrate and a substrate holder in the processing chamber, and by carrying the substrate out of the processing chamber after finishing depositing the nitride film on the substrate and the substrate holder, the film deposition process being performed for a predetermined period of time;

repeating the one operation a predetermined plurality of number of times continuously to deposit the nitride film on a plurality of substrates and the substrate holder in the processing chamber continuously;

oxidizing the substrate holder in the processing chamber without the substrate present in the processing chamber by supplying an oxidation gas into the processing chamber so as to deposit an oxide film on a surface of the nitride film deposited on the substrate holder in the processing chamber, the step of oxidizing the substrate holder being performed for 120 seconds or less, the film deposition process being performed for more than 120 seconds;

carrying a second substrate other than the plurality of processed substrates into the processing chamber after oxidizing the subtrate holder in the processing chamber; and depositing a second nitride film on the second substrate and the oxide film deposited on the subtrate holder in the processing chamber.

2. The method of claim 1, wherein the steps of repeating the one operation the predetermined plurality of number of times continuously and oxidizing the substrate holder in the processing chamber are made in one cycle, and the one cycle is repeated at a predetermined number of cycle times.

3. The method of claim 2, wherein after the one cycle is repeated the predetermined number of cycle times, a new one cycle is set by changing the predetermined plurality of number of times of the one operation.

4. The method of claim 2, wherein after the one cycle is repeated the predetermined number of cycle times, a new predetermined number of cycle times is set by changing the predetermined number of cycle times.

5. The method of claim 1, wherein the step of depositing the nitride film is a step of depositing a TiN film.

6. The method of claim 1, wherein the step of oxidizing the substrate holder in the processing chamber by supplying the oxidation gas is performed by supplying a gas containing oxygen, ozone or water, or a plasma gas thereof.

7. The method of claim 1, wherein the substrate holder includes a susceptor, and the nitride film is deposited on the substrate placed on the susceptor and the susceptor.

8. The method of claim 7, wherein the nitride film is deposited while rotating the susceptor.

9. The method of claim 8, wherein the step of oxidizing the substrate holder in the processing chamber is performed while rotating the susceptor.

10. The method of claim 9, wherein a first rotational speed of the susceptor when oxidizing the substrate holder in the processing chamber is slower than a second rotational speed of the susceptor when depositing the nitride film.

11. The method of claim 7, wherein the susceptor can hold a plurality of substrates thereon, and the step of performing the one operation performs the film deposition process on the plurality of substrates.

12. The method of claim 7, wherein the step of performing the one operation performs the film deposition process on the substrate by an atomic layer deposition method or a molecular layer deposition method.

13. The method of claim 1, wherein the processing chamber includes a wafer boat configured to hold a plurality of substrates at intervals in a vertical direction without contacting the plurality of substrates with each other, and the step of performing the one operation performs the film deposition process on the plurality of substrates held by the wafer boat.

14. The method of claim 13, wherein the steps of carrying the substrate into the processing chamber and carrying the substrate out of the processing chamber are performed in a state of the plurality of substrates held in the wafer boat.

15. The method of claim 1, wherein the step of performing the one operation performs the film deposition process at a substrate temperature of 500 degrees C. or higher.

16. The method of claim 15, wherein the step of performing the one operation performs the film deposition process at a substrate temperature of 550 degrees C. or higher.

* * * * *